(12) United States Patent
Markovich et al.

(10) Patent No.: US 9,373,515 B2
(45) Date of Patent: Jun. 21, 2016

(54) CONDUCTIVE NANOWIRE FILMS

(71) Applicants: RAMOT AT TEL-AVIV UNIVERSITY LTD., Tel Aviv (IL); P.V. NANO CELL LTD., Migdal Ha'Emek (IL)

(72) Inventors: Gil Markovich, Tel Aviv (IL); Daniel Azulai, Rehovot (IL); Tatyana Levi-Belenkova, Tel Aviv (IL); Hagit Gilon, Rehovot (IL); Fernando De La Vega, Zichron Yacov (IL); Ayala Kabla, Rosh Pina (IL)

(73) Assignees: RAMOT AT TEL-AVIV UNIVERSITY LTD (IL); P.V. NANO CELL LTD. (IL)

( * ) Notice: Subject to any disclaimer, the term of this patent is extended or adjusted under 35 U.S.C. 154(b) by 0 days.

(21) Appl. No.: 14/382,396

(22) PCT Filed: Feb. 28, 2013

(86) PCT No.: PCT/IL2013/050184
§ 371 (c)(1),
(2) Date: Sep. 2, 2014

(87) PCT Pub. No.: WO2013/128458
PCT Pub. Date: Sep. 6, 2013

(65) Prior Publication Data
US 2015/0104936 A1 Apr. 16, 2015

Related U.S. Application Data

(60) Provisional application No. 61/605,421, filed on Mar. 1, 2012.

(51) Int. Cl.
*H01L 21/00* (2006.01)
*H01L 21/288* (2006.01)
(Continued)

(52) U.S. Cl.
CPC .......... *H01L 21/288* (2013.01); *C23C 18/1651* (2013.01); *C23C 18/1662* (2013.01);
(Continued)

(58) Field of Classification Search
CPC ....................................................... B82Y 10/00
See application file for complete search history.

(56) References Cited

U.S. PATENT DOCUMENTS 7,083,104 B1 * 8/2006 Empedocles .......... B82Y 10/00
235/491
8,455,048 B1 * 6/2013 Fan ........................ B82Y 30/00
427/240

(Continued)

FOREIGN PATENT DOCUMENTS

EP 2363891 A1 9/2011
WO 2010026571 A2 3/2010
WO 2010130986 A1 11/2010

OTHER PUBLICATIONS

Ahn, B.Y., et al., "Transparent conductive grids via direct writing of silver nanoparticle inks". Nanoscale 2011, 3, 2700-2.
(Continued)

*Primary Examiner* — Zandra Smith
*Assistant Examiner* — Andre' C Stevenson
(74) *Attorney, Agent, or Firm* — Cantor Colburn LLP

(57) ABSTRACT

The invention provides a novel conductive film and a multi-layered conductive structure, comprising a plurality of metal nanowires arranged in clusters and having an average aspect ratio of least 100,000, optionally decorated by metal nanoparticles. It is also disclosed a process for preparation of a conductive film comprising metal nanowires by surfactant/template assisted method which involves the use of a precursor solution based on surfactant (such as CTAB), metal precursor (such as HAuC14 and AgN03) and reducing agent (such as metal borohydride or sodium ascorbate).

6 Claims, 14 Drawing Sheets

(51) Int. Cl.
<table>
<tr><td>C23C 18/44</td><td>(2006.01)</td></tr>
<tr><td>H01L 31/0224</td><td>(2006.01)</td></tr>
<tr><td>H01L 31/18</td><td>(2006.01)</td></tr>
<tr><td>H01B 1/02</td><td>(2006.01)</td></tr>
<tr><td>C23C 18/16</td><td>(2006.01)</td></tr>
<tr><td>H01L 29/45</td><td>(2006.01)</td></tr>
<tr><td>B82Y 40/00</td><td>(2011.01)</td></tr>
<tr><td>G02F 1/1343</td><td>(2006.01)</td></tr>
<tr><td>B82Y 30/00</td><td>(2011.01)</td></tr>
</table>

(52) U.S. Cl.
CPC ...... *C23C18/44* (2013.01); *H01B 1/02* (2013.01); *H01L 29/45* (2013.01); *H01L 31/022466* (2013.01); *H01L 31/022491* (2013.01); *H01L 31/1884* (2013.01); *B82Y 30/00* (2013.01); *B82Y 40/00* (2013.01); *G02F 1/13439* (2013.01); *G02F 2202/36* (2013.01); *Y02E 10/50* (2013.01); *Y10T 428/249921* (2015.04)

(56) References Cited

U.S. PATENT DOCUMENTS

| | | | | |
|---|---|---|---|---|
| 2006/0267595 | A1* | 11/2006 | Bohannan | B82Y 10/00 324/600 |
| 2008/0143906 | A1* | 6/2008 | Allemand | B82Y 10/00 349/43 |
| 2009/0130433 | A1 | 5/2009 | Takada | |
| 2011/0253668 | A1 | 10/2011 | Winoto | |

OTHER PUBLICATIONS

Azulai D. et al., "On-Surface Formation of Metal Nanowire Transparent Top Electrodes on CdSe Nanowire Array-Based Photoconductive Devices", ACS Publications, vol. 4 No. 6 p. 3157-3162.
Azulai D. et al., "Seed Concentration Control of Metal Nanowire Diameter", NANO Letters, vol. 12 No. 11 p. 5552-5558.
Azulai D. et al., "Transparent Metal Nanowire Thin Films Prepared in Mesostructured Templates", NANO Letters, Oct. 23, 2009. vol. 9 No. 12 p. 4246-4249.
International Search Report for corresponding application PCT/IL2013/050184 filed Feb. 28, 2013; Mail date May 28, 2013.
Belenkova T.L. et al. "UV induced formation of transparent Au—Ag nanowire mesh film for repairable OLED devices", Journal of Materials Chemistry, vol. 22 p. 24042-24047, 2012.
De, S.; Higgins, "Silver Nanowire Networks as Flexible, Transparent, Conducting Films: Extremely High DC to Optical Conductivity Ratios". ACS nano 2009, 3, 17.
Grzegorz et al., "Synthesis and Alignment of Silver Nanorods and Nanowires and the Formation of Pt, Pd, and Core/Shell Structures by Galvanic Exchange Directly on Surfaces", Langmuir, 2007, 23 (20), pp. 10357-10365.
Hu et al., "Sub-Two Nanometer Single Crystal Au Nanowire", Nano Lett., 2008, 8 (7), pp. 2041-2044—abstract.
Hu, L.; "Scalable coating and properties of transparent, flexible, silver nanowire electrodes". ACS nano 2010, 4, 2955-63—abstract.
Hubert, F.; "Cetyltrimethylammonium bromide silver bromide complex as the capping agent of gold nanorods". Langmuir 2008, 24, 9219-22.
Kang, M.-G., "Nanoimprinted Semitransparent Metal Electrodes and Their Application in Organic Light-Emitting . Diodes". Advanced Materials 2007, 19, 1391-1396.
Krichevski O. et al., "Formation of Gold-Silver Nanowires in Thin Sufactant Solution Films", Langmuir, vol. 22, No. 3, 2006, 867-808.
Krichevski O. et al., "Growth of Au/Ag nanowires in thin surfactant solution films: An electron microscopy study" Journal of Colloid and Interface Science, May 24, 2007. vol. 314 No. 1 p. 304-309—abstract.
Kumar, A.; Zhou, C. "The race to replace tin-doped indium oxide: which material will win?" ACS nano 2010, 4, 11-4.
Layani, M., "Flexible transparent conductive coatings by combining self-assembly with sintering of silver nanoparticles performed at room temperature". Journal of Materials Chemistry 2011, 21, 15378.
Lee et al., "Control of Current Saturation and Threshold Voltage Shift in Indium Oxide Nanowire Transistors with Femtosecond Laser Annealing", ACS Nano, 2011, 5 (2), pp. 1095-1101—abstract.
Lee, J.-Y."Solution-processed metal nanowire mesh transparent electrodes". Nano letters 2008, 8, 689-92.
Lyons et al., "High-Performance Transparent Conductors from Networks of Gold Nanowires", J. Phys. Chem. Lett., 2011, 2, pp. 3058-3062—abstract.
Nagai et al., "Electric Conductivity-Filled Polymer Composites: Orientation Control of Nanowires in a Magnetic Field", ACS Appl. Mater. Interfaces, 2011, 3 (7), pp. 2341-2348—abstract.
Pérez-Juste, J."Electric-Field-Directed Growth of Gold Nanorods in Aqueous Surfactant Solutions". Advanced Functional Materials 2004, 14, 571-579.
Rathmell, A. R., "The growth mechanism of copper nanowires and their properties in flexible, transparent conducting films". Advanced materials. 2010, 22, 3558-63.
Rathmell, A. R., "The Synthesis and Coating of Long, Thin Copper Nanowires to Make Flexible, Transparent Conducting Films on Plastic Substrates". Advanced Materials 2011, 23, 4798-480.
Reddy, N. K. "Synthesis and cathodoluminescence properties of CdSe/ZnO hierarchical nanostructures". Journal of Materials Chemistry 2011, 21, 3858-3864.
Taub N. et al., "Growth of Gold Nanorods on Surfaces", Journal Phys. Chem. B, vol. 107 No. 45 P. 11579-11582.
Tvingstedt, K.; "Electrode Grids for ITO Free Organic Photovoltaic Devices". Advanced Materials 2007, 19, 2893-2897.
Wang et al., "Ultrathin Au Nanowires and Their Transport Properties" J. Am. Chem. Soc., 2008, 130 (28), pp. 8902-8903—abstract.
Wang et al.,"Facile Synthesis of Ultrathin and Single-Crystalline Au Nanowires" Chemistry—An Asian Journal, pp. 1028-1034, Jul. 6, 2009—abstract.
Zeng, X.-Y.;"A new transparent conductor: silver nanowire film buried at the surface of a transparent polymer". Advanced materials. 2010, 22, 4484-8.
Zhu et al., "Reductive-Oxidation Electrogenerated Chemiluminescence (ECL) Generation at a Transparent Silver Nanowire Electrode", Langmuir, 2011, 27 (6), pp. 3121-3127—abstract.
Zhu et al., "Transparent Conductors from Carbon Nanotubes LBL Assembled with Polymer Dopant with π-π Electron Transfer", J. Am. Chem. Soc., 2011, 133 (19), pp. 7450-7460—abstract.
Written Opinion for corresponding application PCT/IL2013/050184 filed Feb. 28, 2013; Mail date May 28, 2013.

* cited by examiner

CONDUCTIVE NANOWIRE FILMS

FIELD OF THE INVENTION

This invention generally relates to conductive nanowire films and uses thereof.

BACKGROUND OF THE INVENTION

The search for new transparent electrode (TE) materials that would replace the transparent conducting oxides (TCOs), e.g., indium tin oxide (ITO), zinc oxide (ZnO) and fluorine-doped tin oxide ($SnO_2$:F), commonly employed for various opto-electronic applications, has been the focus of a series of extensive studies [1].

This quest has been motivated by two main objectives. First, the ever-increasing price of indium and the deposition process drove the continuous effort to find inexpensive substitutes with similar unique physical properties of high transparency along with low sheet resistivity, and second, the inability of the TCOs family in meeting the special requirements of the new generation devices. For instance, TCOs are not fully compatible with novel plastic based flexible opto-electronic devices. In addition to inexpensive production process, new TE materials have, therefore, to possess a variety of properties such as flexibility and low temperature implementation, while maintaining their physical properties comparable to those of traditional TCOs.

Recently, a few new promising TE candidates were suggested. The majority of those are based on conducting polymers, in addition to nanoscale materials such as carbon nanotubes, graphene flakes, hybrid metal-polymers films [2], nanoscale metallic gratings [3-6], and random networks of metal nanowires (NWs) made of copper [7, 8], silver [9-11] and gold-silver [12,13]. These TEs can potentially meet the new generation device requirements due to their inexpensive deposition processes as well as their flexibility and large-scale implementation. Moreover, their production does not include a high vacuum deposition step, as do traditional TCOs. In addition, the traditional deposition methods are often incompatible with the emerging organic semiconductor based devices such as light emitting diodes or transistors due to sensitivity of the organic material to the sputter-coating process. This is basically true when the TC is required as a top electrode in the final phase of the device production. Some of the new TE materials, such as metallic NWs, have an additional key advantage—their solution-based deposition implementation.

REFERENCES

[1] Kumar, A.; Zhou, C. The race to replace tin-doped indium oxide: which material will win? ACS nano 2010, 4, 11-4.
[2] Zeng, X.-Y.; Zhang, Q.-K.; Yu, R.-M.; Lu, C.-Z. A new transparent conductor: silver nanowire film buried at the surface of a transparent polymer. Advanced materials. 2010, 22, 4484-8.
[3] Kang, M.-G.; Guo, L. J. Nanoimprinted Semitransparent Metal Electrodes and Their Application in Organic Light-Emitting Diodes. Advanced Materials 2007, 19, 1391-1396.
[4] Tvingstedt, K.; Inganäs, O. Electrode Grids for ITO Free Organic Photovoltaic Devices. Advanced Materials 2007, 19, 2893-2897.
[5] Ahn, B. Y.; Lorang, D. J.; Lewis, J. A. Transparent conductive grids via direct writing of silver nanoparticle inks. Nanoscale 2011, 3, 2700-2.
[6] Layani, M.; Magdassi, S. Flexible transparent conductive coatings by combining self-assembly with sintering of silver nanoparticles performed at room temperature. Journal of Materials Chemistry 2011, 21, 15378.
[7] Rathmell, A. R.; Bergin, S. M.; Hua, Y.-L.; Li, Z.-Y.; Wiley, B. J. The growth mechanism of copper nanowires and their properties in flexible, transparent conducting films. Advanced materials. 2010, 22, 3558-63.
[8] Rathmell, A. R.; Wiley, B. J. The Synthesis and Coating of Long, Thin Copper Nanowires to Make Flexible, Transparent Conducting Films on Plastic Substrates. Advanced Materials 2011, 23, 4798-4803.26.
[9] Hu, L.; Kim, H. S.; Lee, J.-Y.; Peumans, P.; Cui, Y. Scalable coating and properties of transparent, flexible, silver nanowire electrodes. ACS nano 2010, 4, 2955-63.
[10] Lee, J.-Y.; Connor, S. T.; Cui, Y.; Peumans, P. Solution-processed metal nanowire mesh transparent electrodes. Nano letters 2008, 8, 689-92.
[11] De, S.; Higgins, T. M.; Lyons, P. E.; Doherty, E. M.; Nirmalraj, P. N.; Blau, W. J.; Boland, J. J.; Coleman, J. N. Silver Nanowire Networks as Flexible, Transparent, Conducting Films: Extremely High DC to Optical Conductivity Ratios. ACS nano 2009, 3, 1767-74.
[12] Azulai, D.; Belenkova, T.; Gilon, H.; Barkay, Z.; Markovich, G. Transparent metal nanowire thin films prepared in mesostructured templates. Nano letters 2009, 9, 4246-9.
[13] WO2010/026571
[14] Hubert, F.; Testard, F.; Spalla, O. Cetyltrimethylammonium bromide silver bromide complex as the capping agent of gold nanorods. Langmuir 2008, 24, 9219-22.
[15] Pérez-Juste, J.; Liz-Marzán, L. M.; Carnie, S.; Chan, D. Y. C.; Mulvaney, P. Electric-Field-Directed Growth of Gold Nanorods in Aqueous Surfactant Solutions. Advanced Functional Materials 2004, 14, 571-579.

SUMMARY OF THE INVENTION

Conductive films (in the nanometric or micrometric range), in particular transparent and conductive films are vastly used in the electronic, solar cells and opto-electronic industries and there is a continuous demand for films with improved features, i.e., conductivity, durability, flexibility as well as transparency and scaled down films. The present invention provides conductive films composed of stacked layers of nanowires, demonstrating improved properties, as further detailed hereinbelow.

In one aspect of the invention, there is provided a conductive film comprising one or more conductive layers, wherein each of said one or more conductive layers comprising an arrangement (assembly) of electrically conductive metal nanowires, said film having the improved characteristics disclosed hereinbelow.

In some embodiments, the film of the invention comprises at least one conductive layer of nanowires, each nanowire having on average an aspect-ratio of at least 100,000. In some embodiments, the film comprises two or more such layers.

In other embodiments, the film comprises at least one conductive layer of nanowires, wherein at least one of said conductive layers comprises an arrangement of one or more electrically conductive clusters of nanowires. In some embodiments, the film comprises two or more such layers. In other embodiments, the film comprises at least one conductive layer of nanowires, wherein a substantial number of said nanowires are arranged as electrically conductive clusters of nanowires; in other words 70% or 80% or 90% or 95% or 99% of the nanowires in the conductive layer are arranged in one or more such clusters.

In further embodiments, the film is a conductive stacked multilayer, wherein at least two of the layers comprise nanowires. In some embodiments the conductive stacked multilayer film comprises 3 or 4 or more layers of nanowires.

In additional embodiments, the film is a conductive stacked multilayer, exhibiting a resistivity proportional to $1/x^n$, wherein x is the number of conductive layers in said multilayer and n being greater than 1.

In some embodiments, the film comprises at least one conductive layer of nanowires, said film exhibiting a resistivity which decreases non-linearly with an increase in metal quantity and/or the number of layers.

In further embodiments, the film comprises at least one conductive layer of metal nanowires, each of said nanowires being a composite of gold and at least one other metal. In further embodiments, the nanowires are of a composite of gold and silver. In some embodiments, the film comprises two or more such layers.

Thus, in another aspect of the invention, there is provided a conductive stacked multilayer comprising at least one or more conductive layers, each of said one or more conductive layers comprising an arrangement (assembly) of electrically conductive metal nanowires (which may or may not be arranged as clusters), the nanowires having on average an aspect-ratio of at least 100,000.

Also provided is a conductive stacked multilayer comprising at one or more conductive layer, each of said one or more conductive layers comprising an arrangement of electrically conductive metal nanowires, each of said nanowires being a composite of gold and at least one other metal.

The invention also provides a conductive stacked multilayer comprising one or more conductive layers, each of said at least two conductive layers comprising an arrangement of at least one electrically conductive cluster of metal nanowires.

The invention further contemplates a conductive stacked multilayer comprising at least two conductive layer, said multilayer exhibiting a sheet resistance proportional to $1/x^n$, wherein x is the number of conductive layers in said multilayer and n being greater than 1. In some embodiments, n is greater than 1 but smaller than 5. In other embodiments, n is between 2 and 3.

In another aspect, the invention provides a conductive film comprising two or more conductive layers, wherein said two or more conductive layers being coaxial to each other and comprising an arrangement (assembly) of electrically conductive metal nanowires (in some embodiments, in the form of nanowire clusters), the nanowires having on average an aspect-ratio of at least 100,000.

The "nanowires film" of the invention comprises of one or more layers of nanowires, which are positioned (stacked) one on top of the other such that the first layer is sandwiched between a substrate surface and a second layer which may or may not be conductive, the second layer being sandwiched between the first and third layers and each subsequent layer is sandwiched between a previous and subsequent layers. The film may comprise one or more additional non-conductive layers which may be positioned between the one or more conductive layers or as a top layer(s).

As a person versed in the art would understand, the layers are not visually distinct and the multilayer, comprising of any number of layers, appears as a single film of randomly intersecting nanowires or clusters thereof. Thus, the multilayer structure making up a film according to the present invention may be determined based on the parameters given herein for the film structure (nanowire aspect ratio, the presence of clusters, etc).

In some embodiments, the number of layers in the multilayer is less than 50. In other embodiments, the number of layers is between 2 to 10. In further embodiments, the number of layers is 2 or 3 or 4 or 5 or 6 or 7 or 8 or 9 or 10 layers. In still further embodiments, the number of layers is 2 or 3 or 4 or 5 layers.

In some embodiments, the film comprises at least one conductive layer and at least one protective top layer.

Each of the layers in the multilayer film of the invention comprises a plurality of metal nanowires arranged in the layer as separate nanowires randomly or directionally distributed. The nanowires within the layer may be arranged individually, as separate nanowires, i.e., each being randomly orientated, or as clusters of nanowires. As used herein, the term "cluster" refers to a group of nanowires which comprises two or more co-directionally oriented nanowires (said two or more nanowires are oriented along the same axis or generally run parallel to each other, e.g., some of the clusters may be curved or branched). The nanowires in a typical cluster are arranged within an organic template formed by the surrounding surfactant material. The surfactant may be arranged as bilayers between each two nanowires, thereby defining the distance between each two nanowires. In some embodiments, the nanowires within the cluster are homogeneously spaced. The distance (space) between each two nanowires (i.e., inter-wire spacing) within the cluster is in the order of a few nanometers. In some embodiments, the distance is less than 20 nm. In other embodiments, the distance is 2 or 3 or 4 or 5 or 6 or 7 or 8 or 9 or 10 nm.

A cluster of nanowires may be further characterized by a plurality of metal granules, namely metal nanoparticles, ranging in size from 3 nm to about 200 nm; the granules decorating (e.g., are in contact with the surface of) one or more nanowires or are positioned at an inter-wire spacing between nanowires in a cluster. In some cases, and depending inter alia on the metal precursor concentration, the length of exposure and other parameters, the metal granules may also be observed at substrate surfaces between the plurality of nanowires or clusters. The shape and density of the granules may change from one metal to the other; however, on average, the granules are spherical in shape and may be in direct contact with one, two, or more nanowires.

Each "nanowire" in the layers making up the film is of a continuous elongated shape (wire) of a material which may be in the form of straight, curved or branched forms, independently of whether the nanowires are arranged in clusters or individually spread on the surface of a substrate. The independent nanowires or clusters thereof may also take on the form of a mesh, namely a formation of closely spaced and randomly crossing metal nanowires, said mesh being conductive throughout, namely at any two arbitrary points thereof.

The nanowire material is typically of a material which renders the nanowire (and thus the film containing it) conductive.

In some embodiments, the nanowire material comprises one or more elemental metal, a metal alloy and/or a metallic compound, e.g., a metal oxide. In some embodiments, the material is metal or alloys thereof. In further embodiments, the material is a metal selected from Sc, Ti, V, Cr, Mn, Fe, Ni, Cu, Zn, Y, Zr, Nb, Tc, Ru, Mo, Rh, W, Au, Pt, Pd, Ag, Mn, Co, Cd, Hf, Ta, Re, Os, Ir and Hg. In some embodiments, the metal nanowires are of a metal selected from gold, silver, copper, nickel, palladium or combinations thereof.

In some other embodiments, the metal nanowires are of gold and silver or combinations thereof.

In some embodiments, the metal nanowires are of gold and silver, or a combination thereof, each nanowire being decorated with metal granules, as further detailed herein, wherein said metal granules are of gold and/or silver. In some embodiments, the metal granules, as defined, are gold granules. In other embodiments, the metal granules, as defined, are silver granules.

The nanowires are on average of an aspect-ratio (the ratio of length of the nanowire to its width) greater than 1,000,000. In some embodiments, the average aspect-ratio is greater than 100,000. In further embodiments, the average aspect-ratio is greater than 50,000. In still other embodiments, the average aspect-ratio is between 10,000 and 100,000.

In further embodiments, the average aspect-ratio is greater than 100, greater than 500, or greater than 1,000.

The nanowires are additionally or alternatively characterized by an average cross sectional diameter of less than 100 nm. In some embodiments, the cross-sectional diameter is less than 50 nm; in other embodiments, less than 10 nm and in further embodiments, the cross-sectional diameter is between 2 and 10 nm, or 2 and 9 nm, or 2 and 8 nm, or 2 and 7 nm, or 2 and 6 nm, or 2 and 5 nm, or 2 and 4 nm, or 3 and 5 nm. In other embodiments, the nanowire cross-sectional diameter is 1 nm, or 2 nm, or 3 nm, or 4 nm, or 5 nm, or 6 nm, or 7 nm, or 8 nm, or 9 nm, or 10 nm.

In some embodiments, each film comprises at least one layer in which the nanowires are arranged in clusters or at least a number of nanowires are arranged in a cluster.

In some embodiments, the invention provides a transparent conductive film, with low sheet resistance, and which comprises at least one layer in which the nanowires are arranged in randomly laid clusters.

In some embodiments, one or more of said nanowire clusters comprises a few to hundreds of distinct nanowires. In some embodiments, the nanowire cluster may comprise between 2 and 500 nanowires.

In some embodiments, the number of nanowires per cluster ranges between 2 and 400, between 2 and 300, between 2 and 200, between 2 and 100, between 2 and 50, between 2 and 40, between 2 and 30, between 2 and 20, between 2 and 10, between 2 and 9, between 2 and 8, between 2 and 7, between 2 and 6, between 2 and 5 or between 2 and 4. In other embodiments, the number of nanowires per cluster ranges between 10 and 500, between 10 and 400, between 10 and 300, between 10 and 100, between 10 and 50, between 10 and 40 or between 10 and 30.

Similarly, the nanowire film as a whole, and each of the layers irrespective of the other in the multilayer, are said to be conductive. Since the nanowire film comprises of metal nanowires, electrical conductivity is observed with electrical charge percolation from one metal nanowire to another. The nanowire film has thus electrical conductivity. As one versed in the art would recognize, the conductivity referred to is a metallic electrical conductivity or ohmic electrical conductivity, i.e., exhibiting linear current/voltage curves.

The films of the invention exhibit high conductivity and low total (film) sheet resistance. The nanowire film of the invention, or the single layers making up the film, present a total sheet resistance which is not linear with the number of layers or metal quantity, namely: the sheet resistance Rs is proportional to $1/X^n$, where X is the number of layers and n>1. In some embodiments, n is greater than 1 but smaller than 5. In other embodiments, n is between 2 and 3.

In some embodiments, the sheet resistance is below 1,000 Ω/square. In other embodiments, the sheet resistance is below 500 Ω/square. In further embodiments, the sheet resistance is below 100 Ω/square. In further embodiments, the sheet resistance is below 50 Ω/square. In other embodiment, the sheet resistance is between 10 to 50 Ω/square. In other embodiment, the sheet resistance is between 50 to 500 Ω/square. In still other embodiments, the sheet resistance is between 100 to 500 Ω/square, in other embodiments, the sheet resistance is between 10 to 100 Ω/square and in yet additional embodiments, the sheet resistance is about 100 Ω/square.

The nanowire film additionally has high transparency to light due to the low volume filling of the metal in the film, namely the occupation of overall only a small surface area by the nanowires. The nanowire film is transparent between 400-800 nm. In some embodiment, the nanowires film is transparent homogenously, enabling production of reliable large scale films having about the same transparency value at each measurement point throughout the film. It should be understood that the term "homogeneously transparent film" or "uniform transparent film" refers to a film having about the same transparency at most regions in the film. The term "about the same transparency" as referred herein means transparency values which may fluctuate within the range of ±5% or ±10% or ±20% of the comparable value. The term "most of the areas" as referred herein means above 90% or above 80% or above 70% of the total film area (or total film area, which is covered with nanowires).

In some embodiments, the homogeneously transparent film may have an area in the scale regime of millimeters or centimeters or decimeters or meters. In some embodiments, the size of the film area is above 1×1 mm². In other embodiments, the size of the film area is above 1×1 cm². In further embodiments, the size of the film area is above 1×1 dm². In additional embodiments, the size of the film area is above 1×1 m². In some embodiments the size of the film area is between 1×1 mm² to 1×1 dm². In some embodiments, the light transmission of the nanowire film is at least 75% and can be as high as 98% depending on the number of layers in the film. In some further embodiments, the transmission is between 75 and 85%.

The invention further provides a conductive film constructed of between 1 and 4 layers of metal nanowires, each nanowire being of gold and silver, said film being characterized by:
  Transparency—75-97% average transmission in the 400-800 wavelength range
  Sheet resistance—10-1,000 Ohm/square
  Thickness (average)—3-30 nm
  Metal content—3-6 mg/m²
  Nanowire aspect ratio—at least 100,000.

In some embodiments, the sheet resistance is below 1,000 Ω/square. In other embodiments, the sheet resistance is below 500 Ω/square. In further embodiments, the sheet resistance is below 100 Ω/square. In further embodiments, the sheet resistance is below 50 Ω/square. In other embodiment, the sheet resistance is between 10 to 50 Ω/square. In other embodiment, the sheet resistance is between 50 to 500 Ω/square. In still other embodiments, the sheet resistance is between 100 to 500 Ω/square, in other embodiments, the sheet resistance is between 10 to 100 Ω/square and in yet additional embodiments, the sheet resistance is about 100 Ω/square.

In some embodiments, the gold-to-silver ratio in each conductive layer is between 100:1 to 1:100. In some embodiments, the Au:Ag ratio is 50:1 to 1:50. In some embodiments, the Au:Ag ratio is 10:1 to 1:10. In some embodiments, the gold-to-silver in each conductive layer is between 9:1 to 1:9. In some embodiments, the Au:Ag ratio is 7:3 to 3:7.

The invention also provides a conductive film constructed of between 1 and 4 layers of metal nanowires, each nanowire being of gold and silver, at least a portion of said nanowires being decorated with one or more metal granules (gold, silver, or combination thereof), said film being characterized by:

Transparency—75-97% average transmission in the 400-800 wavelength range

Sheet resistance—10-1,000 Ohm/square

Thickness (average)-3-30 nm

Nanowire aspect ratio—at least 100,000.

In some embodiments, the sheet resistance is below 1,000 Ω/square. In other embodiments, the sheet resistance is below 500 Ω/square. In further embodiments, the sheet resistance is below 100 Ω/square. In further embodiments, the sheet resistance is below 50 Ω/square.

In other embodiment, the sheet resistance is between 10 to 50 Ω/square. In other embodiment, the sheet resistance is between 50 to 500 Ω/square. In still other embodiments, the sheet resistance is between 100 to 500 Ω/square, in other embodiments, the sheet resistance is between 10 to 100 Ω/square and in yet additional embodiments, the sheet resistance is about 100 Ω/square.

In some embodiments of any aspect of the invention, the gold-to-silver ratio in each conductive layer is between 100:1 to 1:100. In some embodiments, the Au:Ag ratio is 50:1 to 1:50. In some embodiments, the Au:Ag ratio is 10:1 to 1:10. In some embodiments, the gold-to-silver in each conductive layer is between 9:1 to 1:9. In some embodiments, the Au:Ag ratio is 7:3 to 3:7.

In another aspect, the invention provides a conductive film characterized by an arrangement (assembly) of electrically conductive metal nanowires, the nanowires having an averaged aspect ratio of at least 100,000, at least a portion of said metal nanowires being arranged in clusters, wherein each cluster comprises between 2 and 500 nanowires, and wherein said conductive film having a transparency of between 75 and 97% and sheet resistance of between 50 and 1,000 Ohm/square.

The invention further provides a conductive film comprising at least one or more conductive layers, each of said one or more conductive layers comprising an arrangement (assembly) of electrically conductive metal nanowires (which may or may not be arranged as clusters), the nanowires having on average an aspect-ratio of at least 100,000, and wherein each of said nanowires being a composite of gold and at least one other metal.

In another aspect, the invention provides a conductive film characterized by an arrangement (assembly) of electrically conductive metal nanowires, the nanowires having an averaged aspect ratio of at least 100,000, at least a portion of said metal nanowires being arranged in clusters, wherein each cluster comprises between 2 and 500 nanowires and a plurality of metal granules in direct contact with one or more of said nanowires.

The present invention also provides a process for the preparation of a conductive film according to the present invention. Generally, the process of the invention is a self-assembly type process where the nanowire film forms spontaneously on contacting, e.g., dipping, coating, printing, the substrate with a growth solution. This process allows for nanowire deposition one on top of the other and enables tuning of optical transmission vs. conductivity. As demonstrated hereinbelow, the films of the invention form electrical contact to semiconductor substrates, demonstrating low contact resistance, on which they are deposited without any special treatments. This is demonstrated by depositing the transparent electrode films on a vertical array of CdSe nanowires electrochemically grown in a track etched polycarbonate membrane to produce a functional photoconductor with up to 15-fold photocurrent gain and an apparent ohmic contact to the CdSe nanowire elements.

Thus, the invention provides a process for the production of a conductive film on a surface of a substrate, said process comprising:

(a) obtaining an aqueous precursor solution comprising at least one metal precursor, at least one surfactant and at least one metal reducing agent, wherein said at least one metal reducing agent triggers formation of metal seed particles in solution;

(b) forming a thin-film of the precursor solution on at least a portion of a surface of the substrate; and (c) allowing formation of a layer of metal nanowires;

(d) optionally repeating steps (a), (b) and (c) on top of the layer of metal nanowires (obtained in step (c)), wherein said steps are repeated one or more times to thereby obtain a stacking of two or more metal nanowire layers; and (e) optionally, treating the film with a solution comprising at least one surfactant, at least one metal precursor and at least one weak metal reducing agent (e.g., an ascorbate salt);

wherein one or both of steps (d) and (e) are carried out; to thereby obtain a conductive film of nanowires on at least a portion of said surface.

In some embodiments, step (d) is carried out one or more times and step (e) is not carried out.

In some embodiments, step (d) is not carried out and step (e) is carried out.

In some embodiments, the process comprises:

(a) obtaining an aqueous precursor solution comprising at least one metal precursor, at least one surfactant and at least one metal reducing agent, wherein said at least one metal reducing agent triggers formation of metal seed particles in solution;

(b) forming a thin-film of the precursor solution on at least a portion of a surface of the substrate; and (c) allowing formation of metal nanowires layer;

(d) treating the film with a solution comprising at least one surfactant, at least one metal precursor and at least one weak metal reducing agent (e.g., an ascorbate salt);

thereby obtaining a conductive film of nanowires on at least a portion of said surface.

In some embodiments, the process of the invention comprises a step of pre-treating the surface of the substrate to prepare it to better receive the deposition of the solution. The pre-treatment may include, in a non-limiting fashion, solvent or chemical washing (e.g., by a non-liquid medium such as a gas), etching, heating, deposition of an optionally patterned intermediate layer to present an appropriate chemical or ionic state to the nanowire formation, as well as further surface treatments such as plasma treatment, UV-ozone treatment, or corona discharge.

In some embodiments, the process further comprises the step of post-treating the resulting conductive nanowire film. In some embodiments, the post-treatment involves at least one of washing the conductive nanowire film with an aqueous or organic liquid or solution to e.g., remove excess surfactant, and thermally treating the film, e.g., at a temperature not exceeding 120° C.

In further embodiments, post-treatment involves forming a protective layer on top of the upper-most layer (being one or more conductive layers) by treating the top layer with a solution comprising at least one surfactant, at least one metal precursor, wherein in some embodiments the metal precursor is of gold and/or silver, and at least one weak metal reducing agent (e.g., an ascorbate salt), to thereby reconstruct or correct fractures in the formed nanowires. In some embodiments, the treating of the top layer to form the protective layer is achieved by placing (e.g., dipping) on top of the substrate surface said solution. The contact with the solution, e.g., by dipping, may be for a few minutes, e.g., 1, 2, 3, 4, 5, 6, 7, 8, 9, 10, 11, 12, 13, 14, 15, 16, 17, 18, 19 or 20 minutes or more.

The post-treatment may include, in a non-limiting fashion, etching, lamination, heating, deposition of an optionally other layer, as well as further surface treatments such as plasma treatment, UV-ozone treatment, or corona discharge.

In some embodiments, the process comprises the step of washing each nanowire layer with an alcohol solution, such as ethanol (e.g. 70% ethanol, or absolute ethanol) to remove excess surfactant, nanoparticles, unreacted metal salts etc. Subsequently, the washing solution may be allowed to dry.

The aqueous solution comprising the at least one metal precursor, at least one surfactant and at least one metal reducing agent, herein referred to as the precursor solution, may be prepared by forming a solution or a mixture (by mixing, admixing) of the components together at a temperature which permits complete dissolution of the components in each other or in an inert medium (such as water), permitting formation of a substantially homogenous solution. It should be noted, that the term "solution" should be given its broadest definition to encompass a liquid state in which one component is fully dissolved in another or in a liquid medium, a liquid state of emulsion (nano- or microemulsion) of one or more components of the precursor solution in another or in a medium, and a state of dispersion (nano- or microdispersion) of one or more components of the precursor solution in another or in a medium. In some embodiments, the precursor solution is a homogenous nano- or micro-emulsion.

In some embodiments, the aqueous precursor solution further comprises nanoparticles, said nanoparticles need not be of the same metal as the metal precursor. In some embodiments, said nanoparticles are of a material selected from metal and semiconductor. In some embodiments, said nanoparticles are metal nanoparticles.

In some embodiments, the nanoparticles are metal nanoparticles having an averaged diameter of about 1.4 nm to 3 nm, e.g., Nanogold particles.

In other embodiments, the metal nanoparticles are pre-formed metal/semiconductor/metal oxide seeds.

In some embodiments, the amount of said nanoparticles is catalytic.

In some embodiments, one or more of said at least one metal reducing agent may be replaced with metal nanoparticles having an averaged diameter of about 1.4 nm to 3 nm, e.g., Nanogold particles. In some other embodiments, one or more of said at least one metal reducing agent may be replaced with pre-formed metal, or semiconductor, or metal oxide seeds (e.g., nanoparticles).

The precursor solution is prepared, in some embodiments, by combining (mixing, admixing) the components at room temperature. In some other embodiments the mixing is carried out at a temperature above room temperature, e.g., in different embodiments the temperature is between 25-100° C., between 25-75° C., between 30-50° C., between 30-40° C., between 40-75° C., or between 50-75° C.

In some embodiments, the precursor solution is prepared by first forming a solution of at least two of the components, e.g., the at least one first metal precursor and at least one surfactant at a temperature allowing dissolution of one component in the other, or both components in an inert medium such as water (or another medium which permits their dissolution or emulsification), followed by the addition (e.g., by way of admixing) of the at least one other component, e.g., reducing agent and/or at least one second metal precursor, while maintaining the temperature so as to sustain a substantially homogenous solution.

In some embodiments, the aqueous precursor solution is prepared by first forming a solution of at least one first metal precursor, at least one surfactant and at least one second metal precursor at a temperature allowing dissolution, followed by the addition of at least one reducing agent.

In some embodiments, the aqueous precursor solution is prepared by first forming a solution of at least one first metal precursor, at least one surfactant, at least one reducing agent and at least one second metal precursor at a temperature allowing dissolution, followed by the addition of at least one second reducing agent.

The process of the invention is suitable for the preparation of a great variety of conductive metal nanowires. The metal nanowires may be of any of the metals recited hereinabove, including gold, silver, copper, nickel, palladium, platinum or combinations thereof. The at least one metal precursor is thus a metal precursor containing the element (in any form, e.g., ionic or non-ionic) making up the nanowire. Typically, the metal precursor is in the form of metal ions or in a form which under the reaction conditions dissociates into metal ions. Non-limiting examples of metal precursors are chloroauric acid, $HAuCl_4$, as a source of gold; $AgNO_3$ as a source of silver; $(NH_4)_2PdCl_6$ as a source of palladium; $Cu(NO_3)_2$ as a source of copper; $NiCl_2$ as a source of nickel; and $H_2PtCl_6$ as a source of platinum.

In some embodiments, the at least one metal precursor is a single metal precursor. In other embodiments, the at least one metal precursor is a combination of two or more metal precursors of the same metal or of different metals.

In some embodiments, the metal precursor is a gold precursor, such as chloroauric acid. In other embodiments, the metal precursor is a combination of gold and silver metal precursors. In still further embodiments, the metal precursor is a combination of palladium, silver and/or gold metal precursors.

The metal precursor concentration is about at least 1 mM. In some embodiments, the concentration is between 1 and 15 mM. In other embodiments, the concentration is between 1 and 10 mM.

The at least one surfactant may be a single surfactant or a mixture of two or more surfactants. The at least one surfactant is typically selected amongst cationic-type surfactants, typically quaternary ammonium based molecules, such as those having at least one alkyl chain of 10 or more carbon atoms; in some embodiments of at least 14 carbon atoms, e.g., 14, 16 or 18 carbon atoms. In some embodiments, the at least one surfactant has one alkyl chain of between 14 and 16 carbon atoms. In other embodiments, the at least one surfactant is a multi-chain surfactant having two or more alkyl chains, each of between 10 and 16 carbon atoms.

Non-limiting examples of said surfactant are cetyltrimethylammonium bromide (CTAB), didodecyldimethylammonium bromide, tetradecyltrimethylammonium bromide, didecyldimethylammonium bromide, cetyltrimethylammonium chloride, didodecyldimethylammonium chloride, tetradecyltrimethylammonium chloride, didecyldimethylammonium chloride, cetyltrimethylammonium iodide, didodecyldimethylammonium iodide, tetradecyltrimethylammonium iodide and didecyldimethylammonium iodide.

In some embodiments, the concentration of the at least one surfactant is above 5%, in further embodiments above 10%, in still other embodiments above 15%, and in yet other embodiments, the concentration is above 20%. In some additional embodiments, the surfactant concentration is at most 30%. In additional embodiments, the surfactant concentration is between 7.5 and 21%.

The at least one reducing agent employed in the precursor solution is an agent capable of reducing the at least one first and/or second metal precursors. In some embodiments, the metal reducing agent is inorganic and in other embodiments, the metal reducing agent is an organic agent. Non-limiting examples of such reducing agents are metal borohydride, e.g., such as sodium borohydride and other hydride derivatives, such as cyanoborohydride, sodium ascorbate, hydroquinone and hydroquinone derivatives, hydrazine and hydrazine derivatives, such as methylhydrazine and any combinations thereof.

In some embodiments, the at least one reducing agent is two or more agents introduced into the reaction mixture at the same time or at different times. In some embodiments, the two or more reducing agents are different in their reducing ability; the first may be a weak reducing agent such as sodium ascorbate and the second may be a strong reducing agent such as a metal borohydride.

In some embodiments, the second reducing agent, e.g., metal borohydride may be replaced by metal nanoparticles having an averaged diameter of about 1.4 nm to 3 nm, e.g., Nanogold particles.

In other embodiments, the second reducing agent, e.g., metal borohydride may be replaced by adding pre-formed metal/semiconductor/metal oxide seeds.

In some embodiments, the aqueous precursor solution is prepared by:
  (i) combining at least one surfactant, at least one first metal precursor and at least one metal reducing agent in an aqueous medium; and
  (ii) inducing metal reduction of said at least one first metal precursor.

In some embodiments, the reduction of the at least one first metal precursor (a first metal precursor) is induced by the addition of at least one second metal precursor. In some embodiments, said at least one second metal precursor is a silver metal precursor.

In further embodiments, the at least one first metal precursor is gold metal precursor and the aqueous precursor solution is obtained by:
  (i) forming a solution of at least one surfactant, at least one gold metal precursor and at least one metal reducing agent in an aqueous medium;
  (ii) adding into the aqueous solution at least one silver metal precursor to thereby induce reduction of said at least one gold metal precursor.

In other embodiments, the metal reducing agent is sodium ascorbate.

In yet additional embodiments, the concentration of said at least one surfactant is between 1% and 10% (w/w) of the total weight of the precursor solution. In some embodiments, the concentration is between 1% and 5%. In other embodiments, the concentration is between 1% and 3%. In other embodiments the concentration is between 1% and 2%. In still further embodiments, the surfactant concentration is 1.6% (w/w).

Thus, the process comprising:
  (a) obtaining an aqueous precursor solution, said solution being prepared by:
    (i) forming a solution of at least one surfactant at a concentration of between 1-10% (w/w), at least one gold metal precursor and sodium ascorbate in an aqueous medium;
    (ii) adding at least one silver metal precursor;
  (b) forming a layer of the solution of step (a) on at least a portion of a surface of a substrate; and
  (c) optionally repeating step (b) one or more times on top of a preceding layer, as detailed hereinabove;
  (d) treating the film with a solution comprising at least one surfactant, at least one metal precursor and at least one weak metal reducing agent (e.g., an ascorbate salt);
  thereby obtaining a gold/silver nanowire film on at least a portion of a surface.

As above, the concentration of said at least one surfactant is between 1% and 10% (w/w) of the total weight of the precursor solution. In some embodiments, the concentration is between 1% and 5%. In other embodiments, the concentration is between 1% and 3%. In other embodiments the concentration is between 1% and 2%. In still further embodiments, the surfactant concentration is 1.6% (w/w).

Thus, in some embodiments, the process for the preparation of a conductive nanowire film on a surface of a substrate comprises:
  (a) obtaining an aqueous precursor solution, said solution being prepared by:
    (i) forming a solution of at least one surfactant at a concentration of between 1-10% (w/w), at least one gold metal precursor and at least one silver metal precursor and at least one ascorbate reducing agent in an aqueous medium;
    (ii) adding a metal borohydride (or nanoparticles as detailed hereinbelow);
  (b) forming a layer of the solution of step (a) on at least a portion of a surface of a substrate; and
  (c) optionally repeating step (b) one or more times on top of a preceding layer;
  (d) treating the film with a solution comprising at least one surfactant, at least one metal precursor and at least one weak metal reducing agent (e.g., an ascorbate salt);
  thereby obtaining a gold/silver nanowire film on at least a portion of said surface.

In some embodiments, the step of adding a metal borohydride is replaced by adding metal nanoparticles having an averaged diameter of about 1.4 nm to 3 nm, e.g., Nanogold particles.

In other embodiments, the step of adding a metal borohydride is replaced by adding pre-formed metal/semiconductor/metal oxide seeds.

The at least one surfactant employed with this process of the invention, is as defined hereinabove.

In some embodiments of all processes of the invention, the at least one surfactant is one comprising at least one quaternary ammonium group.

As the process recites, upon formation of the precursor solution, the solution or an aliquot thereof is placed on at least a portion of the surface to be coated (which had optionally been pre-treated) and a thin-film is allowed to form thereon.

The thickness of the film depends on the thickness of each of the layers, as may be measured after removal of excess surfactant, unreacted materials and metal nanoparticles and further after drying (e.g., evaporation) of the washing solution, as further detailed herein. The thickness of the film which is formed is between 10 and 100 nm.

The surface of a substrate or an object on which the first layer is formed according to the process of the present invention may be of any rigid or flexible substrate or object. The substrate can be clear (transparent; any degree of transparency) or opaque. The surface may be hydrophobic or hydrophilic in nature (or at any degree of hydrophobicity/hydrophilicity or a surface which may be switched between the two states). The surface may be an organic or inorganic surface such as a silicon surface (such as a standard, polished silicon wafer), a fused silica surface (such as a standard fused silica window polished to optical quality), a carbon surface (such as a highly oriented pyrolitic graphite), a surface of a relatively smooth polymer sheet (such as polycarbonate copying machine transparency film and a semiconducting polymer layer comprising the active layer of an organic light emitting diode made, for example from MEH-PPV or doped polyacetylene), and any other surface.

The surface may be whole surface or a portion thereof. The portion (region) of the substrate's surface to be coated may be of any size and structure, the portion may be continuous or comprise of several non-continuous sub-regions on the surface. In some embodiments, the surface of the substrate is substantially two-dimensional. In other embodiments, the surface is that of a three-dimensional object. In other embodiments, the at least one portion of the substrate's (or object's) surface is its whole surface.

Once the surface is covered, partially or wholly, with a film according to the invention, it is washed and thereafter the washing solution is allowed to dry (to be evaporated). Unlike processes of the art, drying of the multilayered film produced by the process of the present invention is not necessary.

In some embodiments, nanowire formation in each of the layers may be induced (initiated), accelerated or generally controlled (controlling the morphology of the nanowires, their formation, their length, aspect ratio, cluster formation, accelerating their formation, arresting their formation, etc) by irradiating the film of the precursor solution (on at least a portion of the surface of a substrate) with ultraviolet light (UV). In some embodiments, the film is irradiated with a UV light at 254 nm (e.g., mercury lamp). The exposure duration may be from a few seconds to a few hours depending on the thickness of the film, the concentration of the surfactant, the temperature of the film, the size of the substrate and other factors.

In some embodiments, the film is exposed to a 100 W mercury lamp, in some embodiments, for 1-30 minutes.

Thus, the invention also provides a process for the preparation of a nanowire film on a surface of a substrate, said process comprising:
(a) obtaining an aqueous precursor solution comprising at least one metal precursor, at least one surfactant and at least one metal reducing agent;
(b) forming a thin-film of the precursor solution on at least a portion of a surface of a substrate; and
(c) irradiating the thin film of the precursor solution with UV to trigger nanowire formation; and
(d) once a nanowire film is formed, optionally repeating step (b) one or more times, wherein the at least one metal reducing agent is selected amongst weak reducing agents (such as ascorbate salts);
(e) treating the film with a solution comprising at least one surfactant, at least one metal precursor and at least one weak metal reducing agent (e.g., an ascorbate salt);
thereby obtaining a nanowire film on at least a portion of said surface.

The invention further provides a process for the preparation of a nanowire film on a surface of a substrate, said process comprising:
(a) obtaining an aqueous precursor solution comprising at least one metal precursor, at least one surfactant and at least one metal reducing agent;
(b) forming a thin-film of the precursor solution on at least a portion of a surface of a substrate; and
(c) allowing formation of metal nanowires layer; and
(d) optionally repeating step (b) one or more times, wherein the at least one metal reducing agent is selected amongst weak reducing agents (such as ascorbate salts);
(e) treating the film with a solution comprising at least one surfactant, at least one metal precursor and at least one weak metal reducing agent (e.g., an ascorbate salt);
thereby obtaining a nanowire film on at least a portion of said surface.

In some embodiments, said aqueous precursor solution comprising further metal nanoparticles for inducing or triggering formation of metal seed particles in solution, and subsequent formation of metal nanowires.

In some embodiments, the concentration of the at least one surfactant in said solution is at least 5% (w/w).

In some embodiments, the aqueous precursor solution being prepared by:
(1) combining at least one surfactant, at least one first metal precursor and at least one metal reducing agent in an aqueous medium; and
(2) inducing metal reduction of said at least one first metal precursor.

In another aspect, the invention provides a conductive film prepared by a method of the invention, the film being characterized by an arrangement (assembly) of electrically conductive metal nanowires, the nanowires having an averaged aspect ratio of at least 100,000, at least a portion of said metal nanowires being arranged in clusters, wherein each cluster comprises between 2 and 500 nanowires, and wherein said conductive film having a transparency of between 75 and 97% and sheet resistivity of between 50 and 1,000 Ohm/square.

The invention further provides a conductive film prepared by a method of the invention, the film comprising at least one or more conductive layers, each of said one or more conductive layers comprising an arrangement (assembly) of electrically conductive metal nanowires (which may or may not be arranged as clusters), the nanowires having on average an aspect-ratio of at least 100,000, and wherein each of said nanowires being a composite of gold and at least one other metal.

The invention additionally provides a film prepared by a method of the invention, the film being characterized by an arrangement (assembly) of electrically conductive metal nanowires, the nanowires having an averaged aspect ratio of at least 100,000, at least a portion of said metal nanowires being arranged in clusters, wherein each cluster comprises between 2 and 500 nanowires and a plurality of metal granules in direct contact with one or more of said nanowires.

The metal nanowires and the conductive nanowire films of the invention may be fabricated into substantially any device that can utilize such nanostructures or articles associated therewith. Such nanostructures and articles of the invention can be used in a variety of applications, such as sensors (such as electrochemical sensors, mechanical sensors, electromechanical sensors), tags or probes, electrodes (such as transparent electrodes), switches, transistors, displays, photovoltaic cells and other opto-electronic devices.

The structural, chemical and electronic properties of the specific metal nanowire or film may be used in the design and manufacture of a variety of such devices. For some applications, the metal nanowires or films are integrated into a functional component of a device for use, in some non-limiting examples, in surface-enhanced Raman scattering, sub-wavelength optical waveguiding, biolabeling, and biosensing, particularly where the nanowires of composed or gold and/or silver metals.

For other applications, the metal nanowires of the invention and the film comprising same may be further functionalized to impart to the film certain surface properties. Functionalization of the conductive nanowire film of the invention may be through functionalization of the metal nanowires or through functionalization of the exterior surfaces of the film. For certain applications, the nanowire film may also comprise at least one additional additives selected from pigments, semiconductor materials, binders, and others. The additives may be introduced into the precursor solution at the beginning of the manufacturing process or may be added to the individual layers after the nanowires have been formed.

The invention thus provides an electrode structure comprising an electrically conductive film comprising a plurality of electrically conductive nanowires on a substrate, which may or may not be optically transparent. In some embodiments, the electrode structure is configured as a photocathode. In other embodiments, the substrate is optically transparent. The film comprising said plurality of electrically conductive nanowires according to the invention may be a portion of a substrate.

The invention further provides a photocathode structure comprising an optically transparent substrate carrying a layer formed by an arrangement (e.g., a mesh) of the conductive nanowires.

An optically transparent electrode is also provided, said electrode comprising a conductive layer, according to the invention, formed by an arrangement of the conductive nanowires on an optically transparent substrate.

The invention also provides an electronic device comprising an electrodes assembly wherein at least one of the electrodes comprises a conductive layer comprised of an arrangement of conductive nanowires according to the invention on a substrate. In some embodiments, the electronic device is configured and operable as a marker (e.g., unique random pattern of wires having unique distribution/profile of electric and/or magnetic field along the substrate); a sensor (photodetector); a switch (transistor) and other related devices. The electrodes' assembly may be selected from a diode, triode, transistor, etc.

More specifically, the transparent conductive films of the invention may be integrated in devices that requires transmittance of visible, UV, IR, and/or NIR regions of the electromagnetic spectrum, including for example, photoconductors, photodiodes; solar cells; light emitting diodes (LEDs), including organic light emitting diodes and lasers; light sensors, as well as specialized transistors, including organic transistors, inorganic transistors, or hybrid transistors. Other applications for utilization of such coatings are related to the following categories: printed electronics, touch screens, display backplanes and large or small area flexible applications. Flexible applications further include large area arrays, flexible displays, and e-paper (electronic books, journals, newspapers).

There is thus provided a transistor device wherein at least one of source, drain and gate electrodes comprises the electrically conductive layer of the conductive nanowires of the invention, on a substrate.

A transistor device is also provided, wherein the device comprises a gate on insulator structure having an electrically insulating substrate carrying a conductive layer of electrically conductive nanowires according to the invention.

The present invention also provides an electroluminescent screen device comprising a luminescent substrate structure carrying a layer of conductive nanowires according to the invention.

For some applications it may be necessary to embed the nanowire film in a solid matrix, with portions of the nanowires extending from the matrix to enable access to a conductive network. Such a matrix may provide protection to the nanowires from adverse factors such as corrosion and abrasion. The matrix may also offer mechanical properties to the conductive nanowire layer.

Additionally, performance-enhancing layers may be used to further enhance the characteristics of the nanowire film. This, for example, may be achieved by introducing additional layers in the transparent conductor structure of the invention. Thus, in other embodiments, the invention also provides a multi-layer transparent conductor which comprises the conductive nanowire film of the invention and at least one additional layer selected from an anti-reflective layer, an anti-glare layer, an adhesive layer, a barrier layer, and a protective coat.

The invention thus provides a transparent conductor comprising a substrate and a conductive film on at least a portion of a surface of said substrate, the conductive film comprising a plurality of metal nanowires as disclosed herein, and optionally at least one performance enhancing layer, as disclosed.

In some embodiments, the nanowire conductive film is used for multiple conductors in an integrated circuit chip.

For certain applications, the nanowire film may be treated, during manufacture or after it has been formed with a polymeric surfactant such as a cationic polymeric surfactant, so as to endow the nanowires or the film as a whole with increased physical stability. In some embodiments, the polymeric surfactant is poly-diallyldimethylammonium chloride. Alternatively, polymerizable monomers, such as styrene, that can be polymerized after film drying and nanowire formation using a polymerization initiator solution may be employed.

In another aspect, the invention provides an article or a device having at least one surface coated with a conductive film, said film being characterized by an arrangement (assembly) of electrically conductive metal nanowires, the nanowires having an averaged aspect ratio of at least 100,000, at least a portion of said metal nanowires being arranged in clusters, wherein each cluster comprises between 2 and 500 nanowires, and wherein said conductive film having a transparency of between 75 and 97% and sheet resistivity of between 50 and 1,000 Ohm/square.

The invention further provides an article or a device having at least one surface coated with a conductive film, said film comprising at least one or more conductive layers, each of said one or more conductive layers comprising an arrangement (assembly) of electrically conductive metal nanowires (which may or may not be arranged as clusters), the nanowires having on average an aspect-ratio of at least 100,000, and wherein each of said nanowires being a composite of gold and at least one other metal.

In another aspect, the invention provides an article or a device having at least one surface coated with a conductive film, said film characterized by an arrangement (assembly) of electrically conductive metal nanowires, the nanowires having an averaged aspect ratio of at least 100,000, at least a portion of said metal nanowires being arranged in clusters, wherein each cluster comprises between 2 and 500 nanowires and a plurality of metal granules in direct contact with one or more od said nanowires.

It should be appreciated that certain embodiments of the invention, which are, for clarity, described as distinct embodiments, may also be provided in combination in a single embodiment. Conversely, various features of the invention, which are, for brevity, described in the context of a single embodiment, may also be provided separately or in any suitable combination or as suitable in any other described embodiment of the invention.

BRIEF DESCRIPTION OF THE DRAWINGS

In order to understand the invention and to see how it may be carried out in practice, embodiments will now be described, by way of non-limiting example only, with reference to the accompanying drawings, in which:

FIG. 3A is a single layer nanowire film in accordance with prior art processes. FIG. 3B is a single layer nanowire film according to the present invention. FIG. 3C is a nanowire film according to the present invention.

FIG. 6A is a SEM cross-sectional image of a nanowire film deposited on a Si substrate without washing the excess CTAB, which was cut by FIB after deposition of a Pt film on top. FIG. 6B is a TEM image of a similar film deposited on a carbon coated copper grid and FIG. 6C is a higher magnification TEM image of the same film. FIG. 6D is a scheme of the early stages of nanowire formation, as the initial seeding is performed and the substrate brought in contact with the growth solution.

FIG. 7A optical transmission curves for the deposition of four successive layers of Au—Ag nanowires deposited on fused silica. FIG. 7B a plot of changes in the optical transmission and sheet resistance with the number of deposited successive layers.

FIG. 13A presents the I-V curves for nanowire film (AuAgNWM) based (black line) and ITO based (red line) OLED devices. FIG. 13B is the voltage output of photomultiplier representing emitted light as function of applied bias.

DETAILED DESCRIPTION OF EMBODIMENTS

Conductive and transparent devices made of two or more layers of high aspect ratio nanowires clusters have been prepared in accordance with the processes of the invention. The transparent and conductive devices demonstrated the following properties: a sheet resistance of 100 Ω/square and light transmission in the visible range of about 85%.

PART A: Multilayer Film of Nanowires

Procedure 1: A Multilayer Film on a PET Substrate

An aqueous solution (10 ml) of cetyltrimethylammonium bromide (CTAB) (0.25M) at 35° C. was mixed with 500 µl of 25 mM tetrachloroauric acid ($HAuCl_4.3H_2O$) solution and 250 µl of 100 mM silver nitrate ($AgNO_3$) solution. The 425 µl of 1.82M sodium ascorbate solution was added. As a result, the solution color changed from a yellow-brown to colorless. The final step involved the addition of 64 µl of sodium borohydride ($NaBH_4$) solution (20 µM) Immediately after the addition of the $NaBH_4$ the solution was deposited on a substrate and was left for about 30 min; thereafter it was washed in ethanol 70%.

This step was repeated 3 times with a fresh solution mixture each time to thereby obtain a 3-layer film on the substrate.

In some instances, the multilayer film was dipped 10 minutes in an aqueous solution which was prepared as follows: (10 ml) of cetyltrimethylammonium bromide (CTAB) (0.25M) was mixed with 500 µl of 25 mM tetrachloroauric acid ($HAuCl_4.3H_2O$) solution and 425 µl of 1.82M sodium ascorbate solution.

In some cases the reduction was triggered by adding a small amount of $NaBH_4$ (as above).

Figure 1A:
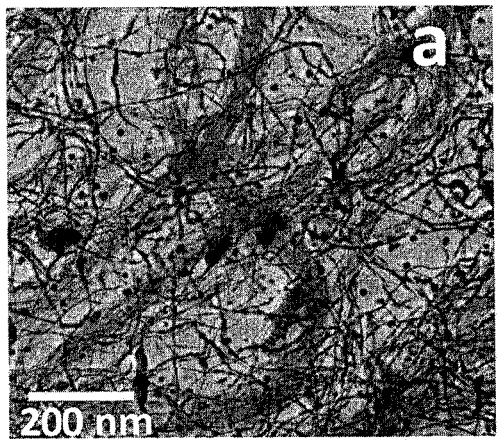
FIGS. 1A-F shows SEM (FIG. 1D, FIG. 1E, FIG. 1F) and TEM (FIG. 1A, FIG. 1B, FIG. 1C) images of a 1 (FIG. 1A, FIG. 1D), 2 (FIG. 1B, FIG. 1E), 3 (FIG. 1C, FIG. 1F) films prepared according to procedure 1 below.
Figure 1D:
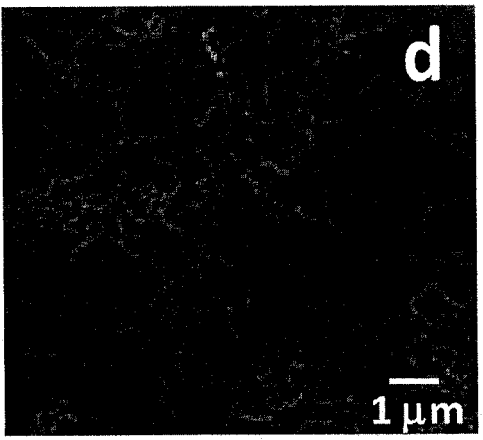
Figure 1B:
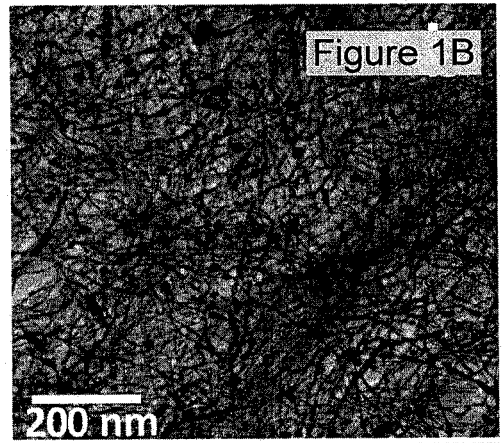
Figure 1E:
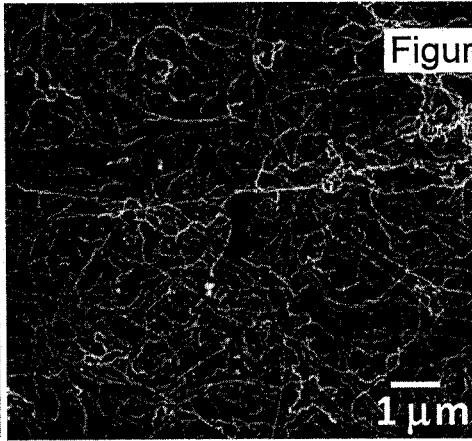
Figure 1C:
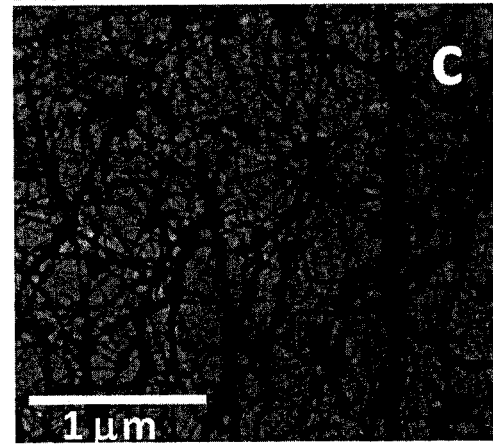
Figure 1F:
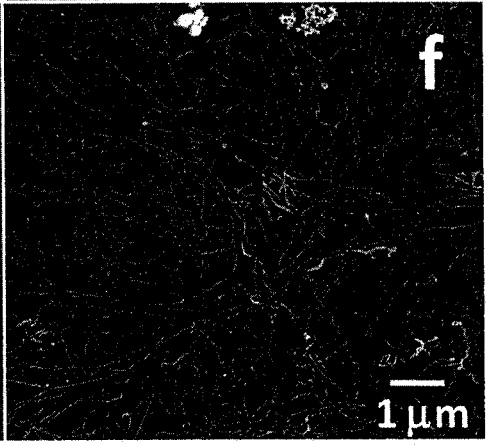
Figure 2:
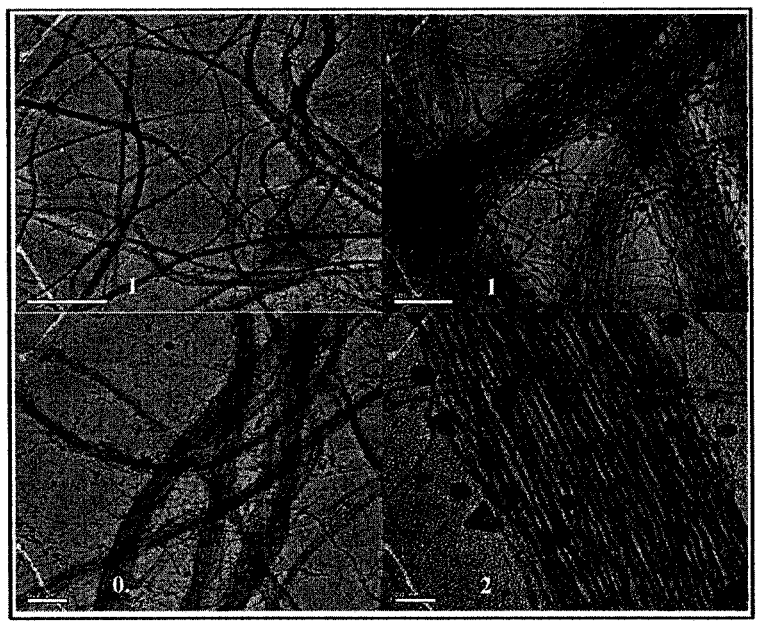
FIG. 2 is a TEM image of a nanowire film, prepared in accordance with procedure 1, displayed at different magnifications.

A SEM image of a film prepared according to this procedure of the invention is shown in FIGS. 1D,E,F. TEM images are provided in FIG. 2.

Procedure 2: A 3-Layer Multilayer on Glass

Procedure 1 above was repeated on a glass substrate for deposition by silanization prior to dipping in the nanowire growth solution.

Each layer was made of clusters of nanowires with very high aspect ratios. A typical cluster contained 10-100 nanowires, each being 2-3 nm wide and the distance between them was of similar dimensions. The cluster length was between 10-100 µm or more, leading to individual nanowire aspect ratios of the order of 50,000. The nanowires consisted of mostly gold and silver and were coated with the surfactant material (CTAB).

The clusters were randomly arranged while the nanowires were well oriented within the clusters.

TABLE 1 sheet resistance and transmission of films with a different number of layers.

| Number of layers | Rs (kΩ sq.) | Transmission at 590 nm |
|---|---|---|
| 1 | 9 ± 1 | 99 ± 1% |
| 2 | 1.5 ± 0.2 | 98 ± 1% |
| 3 | 0.36 ± 0.07 | 93 ± 2% |

As demonstrated in Table 1, the electrical properties of the film can be tuned by the number of layers. While a small reduction in the transmission of the film was observed when the number of layers increased to 3, the sheet resistance was dramatically decreased.

As shown in Table 2, the contact resistance Rc was low: while a single layer exhibited a sheet resistance of many kilo ohms, the contact resistance for the film as a whole was in the range of 500 and 100 ohm/cm². Considering that the wires cover only a fraction of the surface area, the contact resistance was fairly low.

The total sheet resistance was not linear with the number of layers (or metal quantity). The correlation was Rs proportional to $1/X^n$, where X is the number of layers and n>1.

TABLE 2 sheet resistance and contact resistance of films of a different number of layers.

| Number of layers | Rs (kΩ sq.) | Rc (kΩ) |
|---|---|---|
| 1 | 9 ± 1 | 1 |
| 2 | 1.5 ± 0.2 | 0.43 |
| 3 | 0.36 ± 0.07 | 0.32 |
| bath | 0.077 ± 0.020 | 0.32 |

The film of the presented invention comprises very small amounts of metal, as demonstrated in Tables 3.

TABLE 3

| | Metal quantity | | | |
|---|---|---|---|---|
| | Minimum | Maximum | Average | Units |
| SEM (estimated) | 0.002 | 0.004 | 0.003 | g/m² one layer |
| SEM (estimated) | | | 0.014 | g/m² two layer + protection layer; 100-150 ohms |

Single Nanowires Layer Vs. Multilayer

Figures 3A, 3B, 3C:
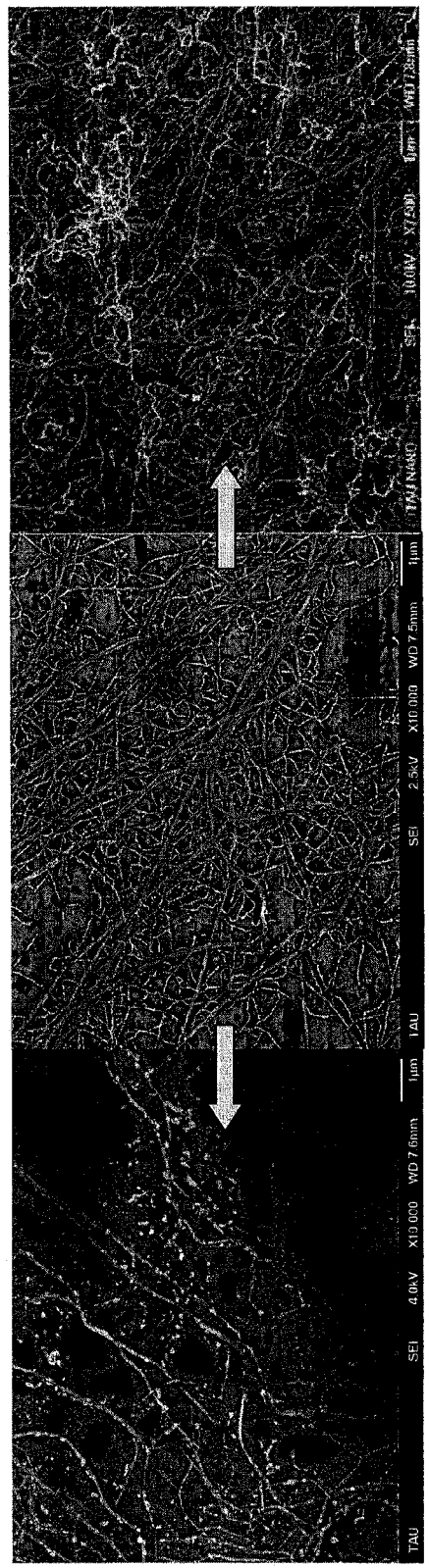
FIGS. 3A-3C are SEM image of nanowires films.

FIG. 3A provide a SEM image of a film comprising a single nanowire layer prepared according to procedure described in the prior art [13], which involves a post-production drying step. FIG. 3B is a SEM image of a film comprising a single nanowire layer with no further treatments and FIG. 3C is a SEM image of a multilayer nanowires film, according to the present invention. The results clearly show a difference in uniformity and quality. The prior art procedure, which involves a drying step, produces clusters that are thicker but more separated from each other and cover the substrate non-uniformly, as well as non-wire metal aggregates. The single monolayer procedure with no further steps, produces thinner clusters, more evenly spaced, uniformly covering the substrate, along with relatively low amount of non-wire metal aggregates. The multilayer according to procedure 1, also shows clusters, which uniformly covered the substrate, and relatively low amount of non-wire metal aggregates compared to the prior art procedure, and therefore, the film has a homogenous transparency.

Therefore, the above results clearly show that, a nanowire film according to the present invention is characterized by a uniform cover of nanowires, leading to a uniform transmittance, as well as good conductivity (low sheet resistance) compared to prior art procedure.

PART B: Nanowires Film by Photo-Reduction

Triggering Photo-Reduction Using a Mercury Lamp

A short illumination with light from a 100 W mercury lamp which provides a strong emission peak at 254 nm over a continuous white spectrum down to about 200 nm was used to photo-reduce metal ions to form small metal seed particles to trigger the start of nanowires growth. About 10 watts hit the 1 cm² sample.

Precursor Solution:

an aqueous solution (10 ml) of cetyltrimethylammonium bromide (CTAB) (0.25M) was mixed with 500 µl of 25 mM tetrachloroauric acid ($HAuCl_4.3H_2O$) solution and 250 µl of 100 mM silver nitrate ($AgNO_3$) solution. Then 425 µl of 1.82M sodium ascorbate solution was added, and the color of the solution changed from a yellow-brown to colorless. The final step involved irradiating the back of a 1 cm² fused silica substrate with the mercury lamp for 10 seconds. The light passed through the substrate, which was located at the liquid-air interface on top of the growth solution, producing a solid (substrate)-liquid interface. Following a 25-minute period of incubation, the substrate was pulled out and the remaining thin film of the precursor solution was allowed to dry out for a few seconds. Then, the substrate was washed for 1 minute in an ethanol/water 70/30 solution. Two strips of silver paint were applied on parallel edges of the substrate in order to create two electrodes for the measurement of sheet resistance.

A second dipping in a gold deposition bath was used to reduce sheet resistance and stabilize the metal nanowires: the aqueous solution (10 ml) of CTAB (0.25M) was mixed with 500 µl of 25 mM $HAuCl_4.3H_2O$ solution. The substrate with the nanowire film was dipped for 10 minutes in this solution and washed for 1 minute in an ethanol/water 70%/30% solution. Subsequently, metal granulates were obtained on the nanowires.

Averaging 5 samples of nanowire films obtained by the UV-irradiation method, a transmittance (at 590 nm) of 97±1% and sheet resistance of 3.0±1.4 kΩ square were obtained. After the additional gold deposition the transmittance was reduced to 91±1% and the sheet resistance was reduced to 165±32Ω square.

PART C: Influence of Seed Particle Size and Concentration on Film Characteristics Three types of gold seed nanoparticles were used:
1. Nanogold (55-60 gold atoms, ~1.5 nm) coated with triphenylphsphine obtained from Molecular Probes; concentration known.
2. Undecagold (11 gold atoms, ~1 nm) coated with triphenylphosphine obtained from Molecular Probes; concentration known.
3. Pre-made by reduction of gold ions in the presence of CTAB—broad size distribution, unknown concentration.

These seed particles, at varying concentrations, were added to the standard nanowire growth solution and carbon coated TEM grid substrates were dipped in the growth solution.

Procedure 1: Seeding the Nanowires with Pre-Prepared Seeds

Nanogold Seeds:

Nanogold seed particles (55-60 gold atoms, ~1.5 nm) coated with triphenylphsphine—were bought from Molecular Probes. An aqueous solution of cetyltrimethylammonium bromide (CTAB) (10 ml, 0.25 M) was mixed with 500 µl of 25 mM tetrachloroauric acid ($HAuCl_4.3H_2O$) solution and 250 µl of 100 mM silver nitrate ($AgNO_3$) solution. Then, 425 µl of 1.8M sodium ascorbate solution was added, as a result the solution color changed from a yellow-brown to colorless. A concentrated seed solution (10-100 µl—depending on experiment) was added and stirred for a few seconds. Then a few drops were deposited on the TEM substrate for 30 min and maintained at 35° C. Washing was done by dipping the substrate gently into the washing solution of ethanol 70% for 15-30 seconds.

When adding 2-7.5×10$^{-10}$ mol of nanogold seeds per 10 mL growth solution, nanowire clusters were formed. However, when the seed concentration was reduced to 1.5×10$^{-10}$ mol of nanogold seeds per 10 mL growth solution, thicker single nanowires were formed with a thickness of 10±5 nm. Lowering the to 3×10$^{-11}$ mol of nanogold seeds per 10 mL growth solution, resulted in nanowires having 15 nm average diameter.

Figure 4:
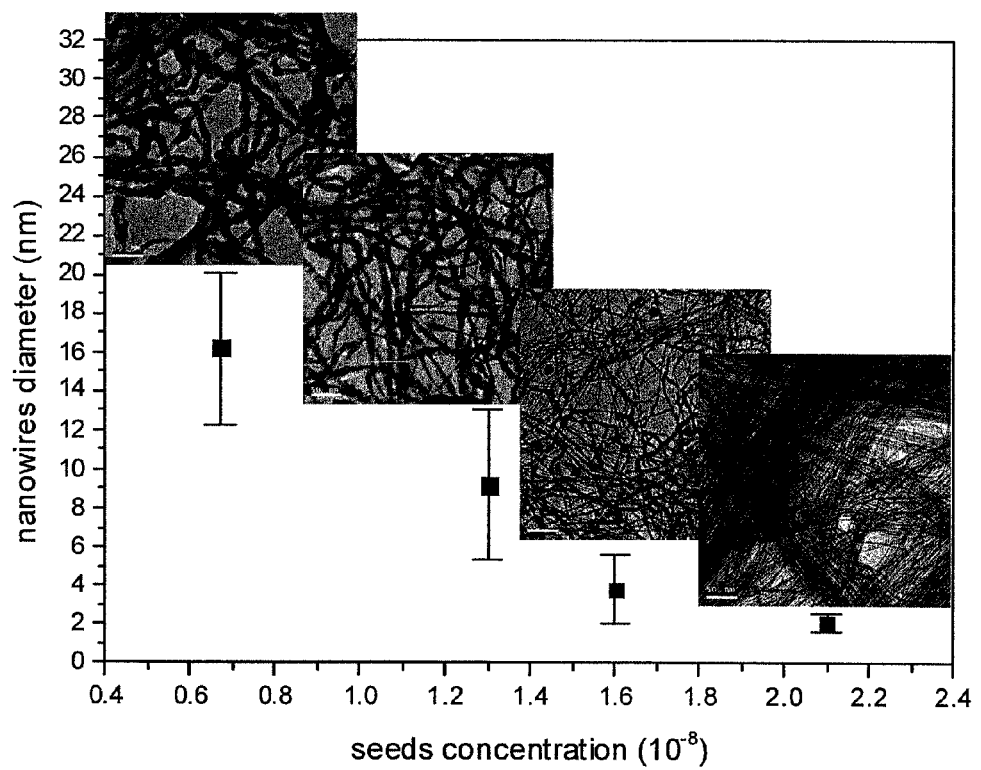
FIG. 4 is a plot which describes the change in average nanowires diameter as a function of the concentration of $Au_{55}$ (Nanogold©) seed particles (1.4 nm) added to the growth solution. TEM images that were taken at each concentration point are also shown. Seed concentration values are given on a $10^{-8}$ mol/L scale

A study of the influence of the seed concentration on the nanowires parameters (diameter) and its arrangement in the film were also conducted. The procedure was repeated several times with different seed concentrations in the standard nanowire growth solution and carbon coated TEM grid substrates were dipped in the growth solution. As FIG. 4 shows, a transformation from clusters of ultra-thin nanowires towards thicker single nanowires was obtained on lowering the concentration of Nanogold seeds added to the growth solution.

Procedure 2: Seeding the Nanowires with Pre-Prepared Seeds
Undecagold Seeds:

(11 gold atoms, ~1 nm) coated with triphenylphosphine were bought from Molecular Probes. Procedure 1 was repeated with Undecagold particles at similar concentrations.

Similar to the Nanogold seeds, at the concentration where it was enough to transform to thin nanowire clusters; the transition here was not distinct. The reaction was slower with the Undecagold seeds relative to the Nanogold.

Procedure 3: Seeding the Nanowires with Pre-Prepared Seeds
CTAB Coated Seeds:

Pre-made seed particles, made by reduction of gold ions in the presence of CTAB.

Au seeds preparation: A CTAB solution (20 mL, 0.05 M) was mixed with 5.0 mL of 0.5 mM HAuCl$_4$. To the stirred solution, 0.60 mL of ice-cold 0.010 M NaBH$_4$ was added, which resulted in the formation of a brownish yellow solution. Vigorous stirring of the seed solution was continued for 2 min Solution stirring speed was 200 rpm at all stages. After the seed solution was prepared, it was kept at 25° C. Observed seed size ~2-3 nm When adding less than 20 µL seed solution per 10 mL growth solution, thick nanowires resulted (as in the low Nanogold concentration). When the seed solution volumes were larger than 20 µL seed solution per 10 mL growth solution, nanowire clusters were formed.

As the above results indicate, the lower the concentration of seeds was, the higher the metal ions per seeds ratio was. This led to a preliminary increase of the low concentration seeds more than the high concentration samples due to diffusion limited reaction (no stirring during nanowire growth). Thus, at the lower seed concentrations, the seeds were already fairly large when adsorbed, inducing formation of larger tubular template structures, while with the higher seed concentration they adsorbed at smaller size and higher density, which led to clusters of much thinner wires.

Another issue is the initial catalytic metal reduction rate which was very slow for Undecagold and fastest for the CTAB seeds. In the case of Undecagold it seemed to be too slow to allow for catalytic growth of the nanowires from the adsorbed seeds.

The diameter of the nanowires in the clusters seemed to be fixed (2-3 nm) regardless of seed size or concentration (assuming that both in the commercial small seeds and the pre-made larger seeds there was a substantial amount of seeds smaller than the final nanowire diameter (≤2 nm)).

Figure 5:
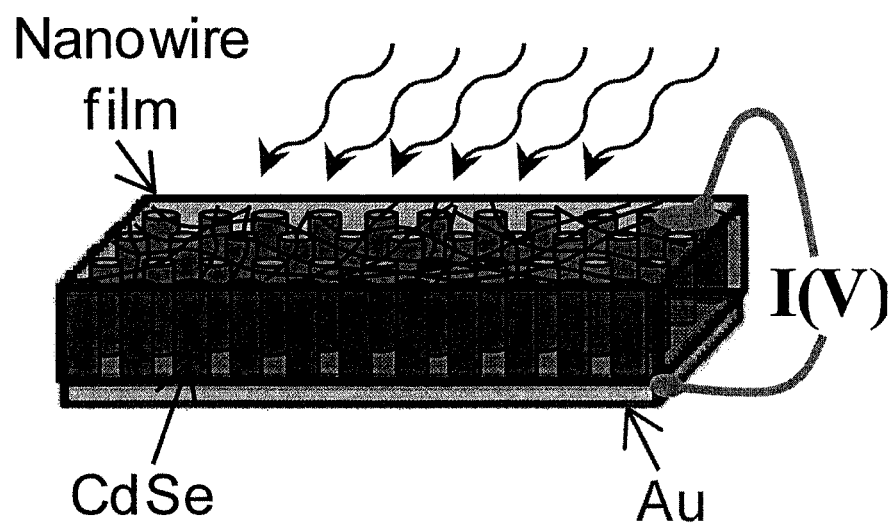
FIG. 5 is a scheme of the construction of the photoconductive device made of the CdSe nanorods deposited in a membrane and the metal nanowires deposited on top.

PART D: Applications
Application 1: On-Surface Formation of Metal Nanowire Transparent Top Electrodes on CdSe Nanowire Array-Based Photoconductive Devices A wet chemical approach was developed for a unique on-surface synthesis of transparent conductive films consisting of ultrathin gold/silver nanowires directly grown on top of CdSe nanowire array photoconductive devices enclosed in polycarbonate membranes. The metal nanowire film formed an ohmic contact to the semiconductor nanowires without additional treatment. The sheet resistance and transparency of the metal nanowire arrays could be controlled by the number of metal nanowire layers deposited, ranging from ~98-99% transmission through the visible range and several kOhm/sq sheet resistance for a single layer, to 80-85% transmission and ~100 Ohm/sq sheet resistance for 4 layers. FIG. 5 shows a schematic presentation of metal nanowire on top of CdSe nanowire array.

A single film of this type deposited on glass, SiO$_2$ or transparent plastic would typically have a sheet resistance on the 10$^3$ Ω/sq scale and net light transmission (relative to the bare substrate) of >98% throughout the visible range.

Addition of a small quantity of a strong reducing agent, such as sodium borohydride, initially reduces a small part of the metal ions to form seed particles. The seed particles are coated by a surfactant bilayer and when adsorbed with excess surfactant to the solution-substrate interface fuse into larger tubular-vesicular structures. Then, additional metal ions complexed with the CTAB are catalytically reduced within these structures by ascorbate anions available in large excess.

The high optical transmission, in addition to the good contact between layers, permitted to perform multiple layer depositions, where after 3 deposition cycles the sheet resistance decreased to ~100 Ω/sq with an optical transmission of ~88% at a wavelength of 600 nm.

Figure 6A:
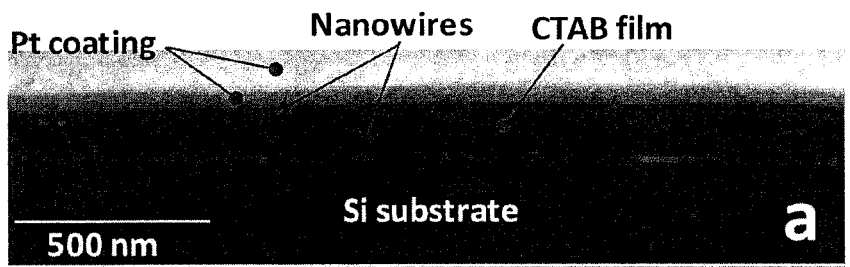
FIGS. 6A-6D are.
Figure 6B:
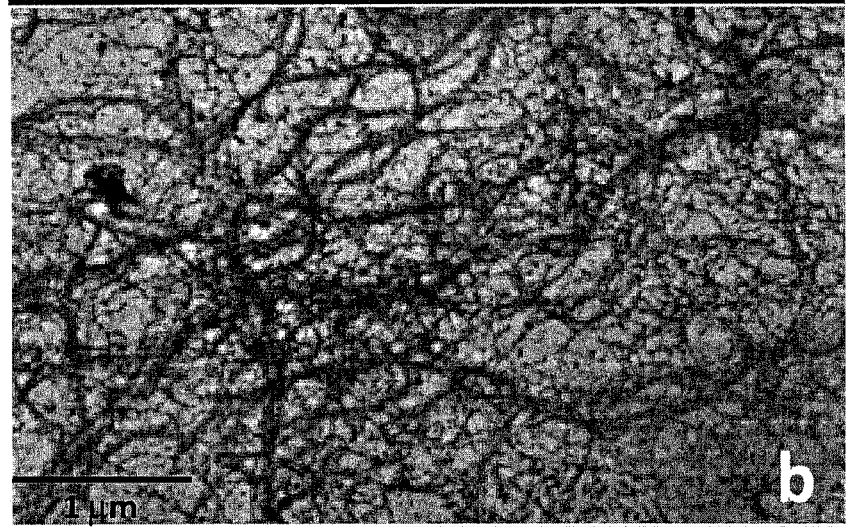
Figure 6C:
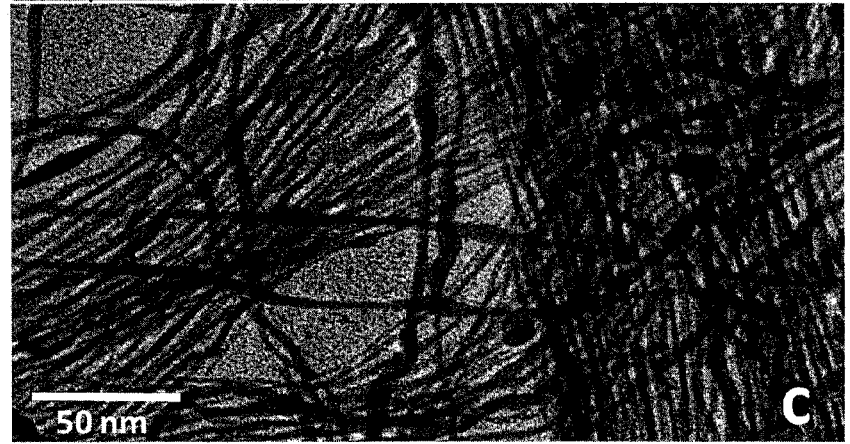

FIG. 6A shows a scanning electron microscope (SEM) image of a focused ion beam (FIB) cut of a nanowire film deposited by the self-assembly process, excess solution removed, and the remaining solution film dried without washing. This cut shows that a ~10 nm thick nanowire film is located primarily at the interface between the substrate and the surfactant film with the occasional formation of an additional layer of wires within the surfactant film, which is ~100 nm thick. Thus, it seems that the particular (tubular) surfactant phase which forms the template for nanowire formation is almost unique to the interface. Such effects of interface sensitive order were also observed in thin films of mesoporous materials using the same surfactant [32].

Figure 6D:
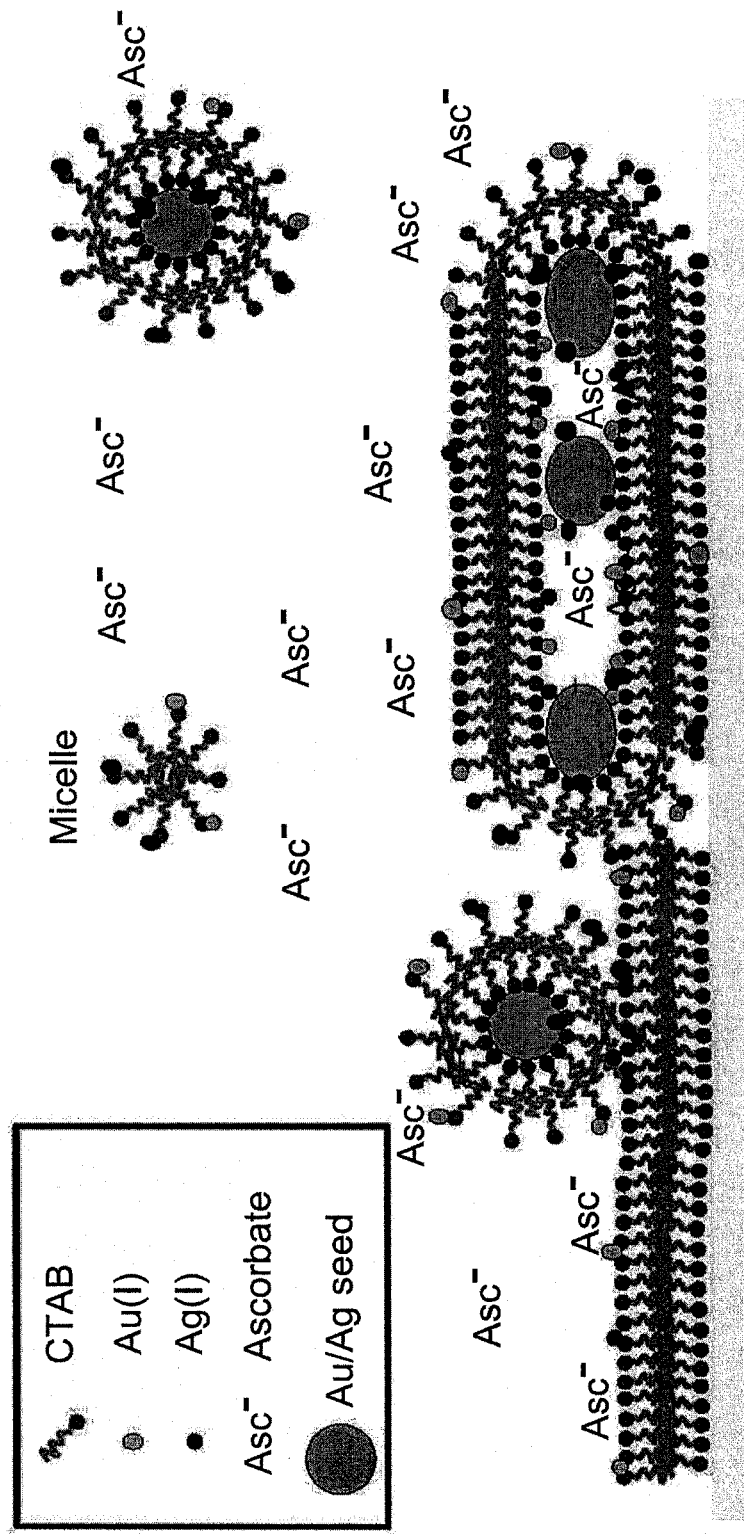

FIG. 6D presents an unbinding description of the current understanding of the mechanism leading to nanowire formation; as the substrate is dipped into the growth solution, after triggering the formation of small metal seed particles in solution, the surfactant molecules quickly accumulate at the substrate-solution interface. In addition, the seed nanoparticles, coated with a surfactant bilayer, also adsorb to this interface and apparently induce the formation of elongated vesicular structures which connect between several seed particles to form long nanotubules filled with solution. These nanotubules contain the ascorbate ions, which catalytically reduce gold and silver ions complexed with the surfactant at the surface of the seed particles and eventually lead to continuous metal nanowires. The ascorbate served as a mild reducing agent. In the presence of gold seeds the chemical potential of the system decreased to enable reduction of the gold and silver ions at the particle surface. This self-assembly process was performed by dipping the substrate in the growth solution after triggering seed formation for ~15-20 minutes, removing the substrate without drying and dipping immediately in a solvent to remove excess surfactant, This process was typically repeated several times in order to achieve the required sheet resistance.

FIG. 1 displays the evolution of the resulting nanowire film along the sequential deposition of 3 layers of nanowires, observed both by TEM and SEM. The first layer the nanowire network seems to be a random mesh primarily consisting of clusters of 2-3 nm diameter Au—Ag NWs, entwined into 50-100 nm wide clusters together with a small amount of thicker ~20 nm single nanowires. Energy dispersive spectroscopy (EDS) measurements of many cluster segments, by TEM, yielded metal atomic ratios in the range of 75%±5% Au to 25%±5% Ag, without an observable change on additional layer deposition.

Figure 7A:
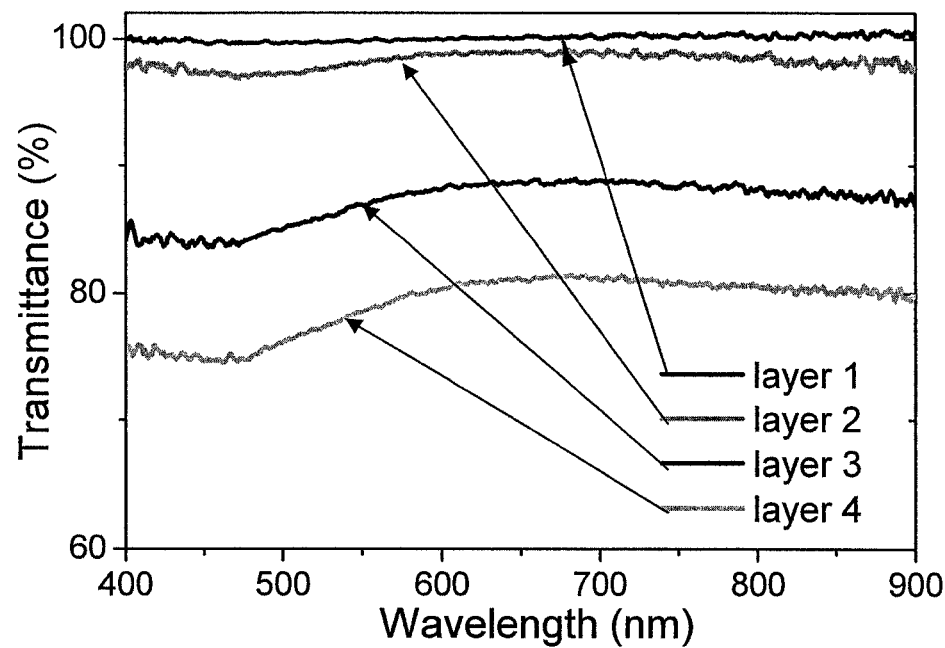
FIGS. 7A and 7B are.
Figure 7B:
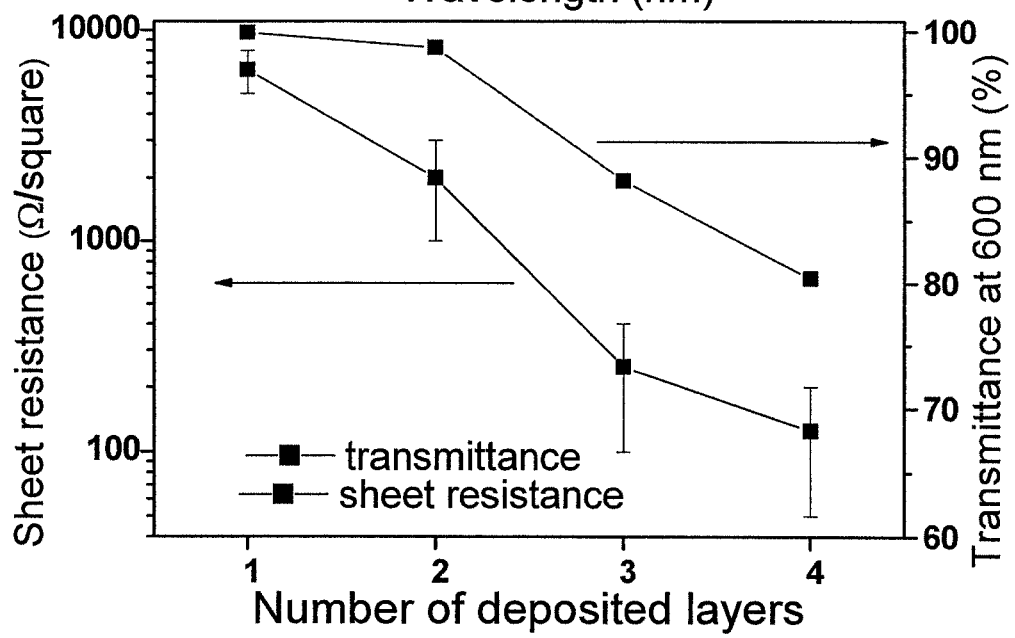

FIG. 7 shows the optical transmission spectra and the corresponding sheet resistance of the Au—Ag NWs random network after 1-4 layers deposition steps. A single deposited layer has a net transmission of ~99% at 600 nm, and a sheet resistance of 5-8 k$\Omega$/Sq. Deposition of a second layer reduced the sheet resistance to 1-3 k$\Omega$/Sq and the resultant transmission to 97-98%. Deposition of a third layer further reduced both the sheet resistance and the transmission of the nanowire film to typical values of 100-400$\Omega$/Sq and 88% (at 600 nm), respectively. The same process was repeated on various substrates, such as silicon, quartz, and polyethylene terphtalate (PET), with up to 5% variation of the measured optical transparency. It should be noted that the transmission data refers to transmission of the film without a substrate.

TEM and SEM images displayed in FIG. 1 can shed light on the relation between the physical properties of the films and the structural evolution of the films with successive deposition steps. The deposition of successive layers resulted in the addition of new nanowire clusters as well as thickening of pre-deposited wires, which caused the suppression of transmission. This effect is accompanied by a parallel reduction of the sheet resistivity due to the formation of a denser network possessing an increased number of percolating pathways and is, therefore, characterized by a higher electrical homogeneity. In that manner, control of the trade-off between electrical and optical properties is attained. This fact facilitates the tailoring of the TE properties to the desired application.

The extensive ongoing effort to produce vertical semiconductor NW array-based devices such as PV cells has influenced our choice to utilize the Au—Ag NWs random network as TEs on top of such a vertical NWs array. Vertical arrays of CdSe NWs were chosen since they were already tested as candidates for photo-detectors due to their notable photo gain.

Characterization of the CdSe NWs, electrochemically grown in the polycarbonate membranes, was performed by dissolving the polycarbonate template using methylene chloride. Electron microscopy and EDS measurements performed showed that the resulting CdSe NWs were polycrystalline, with a chemical composition ratio Cd/Se of ca. 1/1.08.

The Au—Ag nanowire film deposited on top of the membrane filled with CdSe NWs was confined to the center of the membrane by a ring of PDMS, protecting the edges from deposition of nanowires that might short-circuit to the bottom gold electrode.

Figure 8:
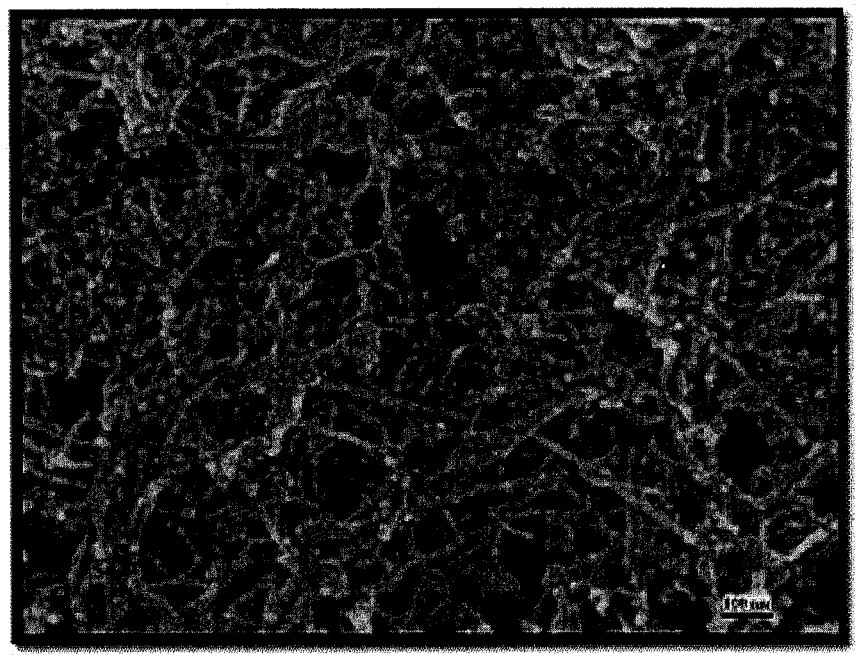
FIG. 8 is a SEM image of the nanowires deposited on top of the polycarbonate membrane filled with CdSe nanowires.

A representative SEM image of the surface of the resulting device (FIG. 8) shows a random network of Au—Ag NW clusters covering the membrane surface, enabling electric contact with nearly each CdSe NW and a percolating pathway across the device. Some metallic aggregates adsorbed to the metallic clusters and un-filled pores were observed as well.

Figure 9:
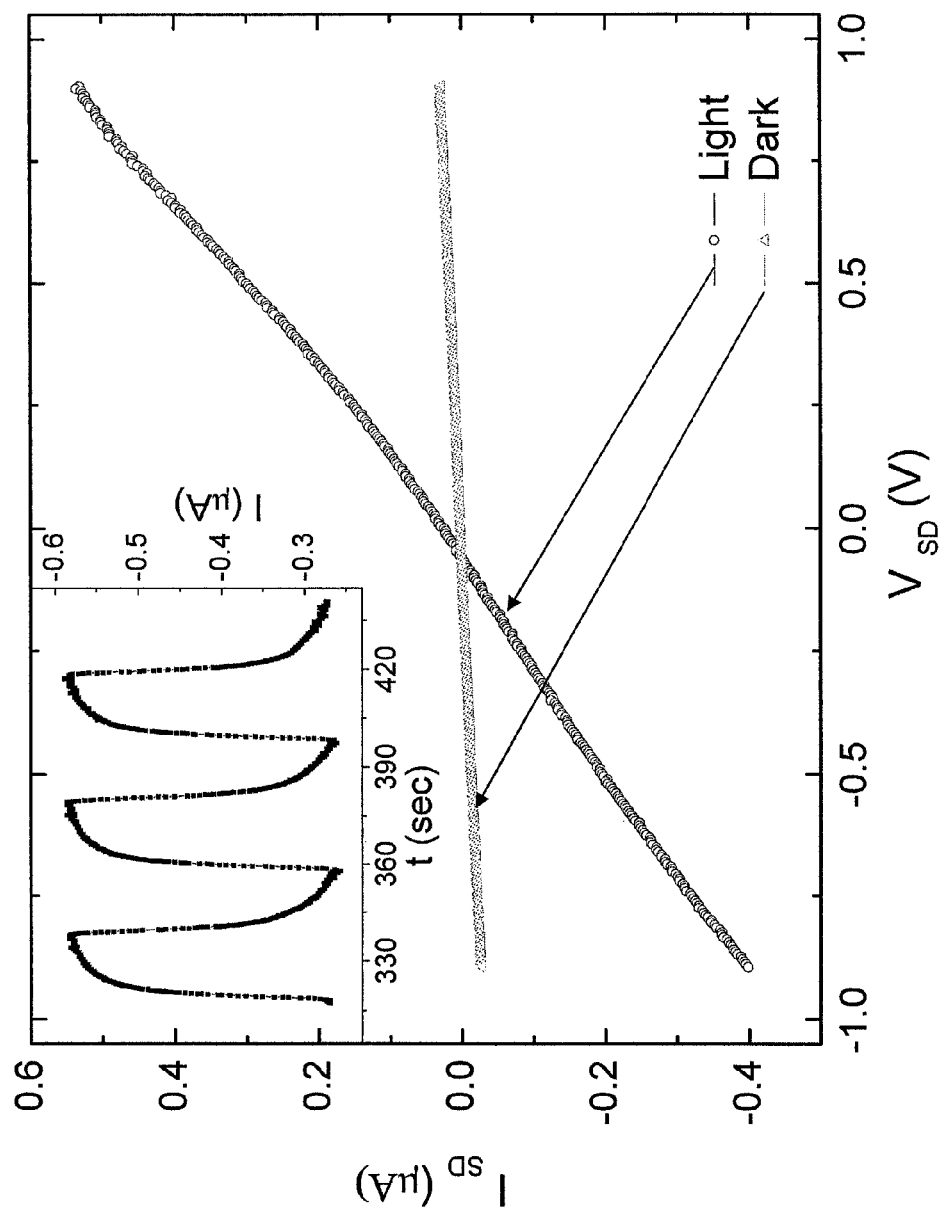
FIG. 9 is a current vs. voltage curves of the CdSe NW-based membrane device, with and without illumination. Inset: current changes in the device with alternating on-off light cycles.

I-V measurements were carried out in a two-probe configuration, employing a probe station, with the bias applied between the Au bottom electrode to the TE via silver paste and the probe station tip. FIG. 9 presents the I-V characteristics of the above-mentioned device measured both in dark and under microscope objective white light illumination. A device resistance of ca. $3 \times 10^7 \Omega$ can be calculated from the dark currents under ±1V. The curve under white-light illumination reveals higher current values throughout the scan from 1V to −1V, implying a decrease of device resistivity by a factor of ca. 15, which was observed in both the positive and negative branches of the I-V curve. This behavior is consistent with light-induced increase of free charge carriers' density due to direct band-gap excitations, with deep-trap and surface states determining the upper limit of the photo-excitation gain. It is likely that the grain boundaries between nanocrystals in the polycrystalline CdSe NWs contribute substantially to this trapping phenomenon. Similar photo-effects were observed for a variety of CdSe NWs diameters and for Ni upper and bottom contacts as well.

Notable photoconductivity is observed in the inset of FIG. 9, representing the effect of switching the light on and off, at 30 s intervals, while maintaining a constant bias of 0.5 V between the bottom contact and the probe station tip.

Response or recovery time of CdSe based opto-electronic devices' photo-gain (NWs, nanorods and thin films) are in the order of microseconds up to milliseconds. The observed slow response time is, therefore, not related to the known excitonic relaxation processes. We believe that the device poor thermal conductivity causing slow thermal processes (heating and cooling) is responsible for the slow response, and indeed, cooling with dry $N_2$ flow during the exposure did show some improvement in the response time.

An important finding resulting from device measurements is the ohmic behavior of the I-V curves. This indicates that the metal nanowire TE film was able to form a good contact to the underlying CdSe NW elements, in spite of the concentrated CTAB surfactant environment used for this deposition. This is in agreement with the SEM image of the FIB cut shown in FIG. 6a, indicating that the nanowire film is located precisely at the interface, probably exposing part of the metal towards the substrate.

This invention provides a simple solution-based deposition approach to easily form a metal nanowire-based top transparent contact to a photo-conductive device, showing ohmic current/voltage characteristics. The sheet resistance and optical transmission of the film could be controlled by changing the number of deposited nanowire layers.

In general, an important aspect of the deposition of the TE film is that it does not require any thermal treatment that may harm the underlaying active layer of the device. This is particularly important in devices consisting of organic materials.

The problem of deposition of top contacts on various types of organic and inorganic semiconductor films is still not well resolved using existing technologies and such a simple solution-based deposition approach may offer an advantage over existing methods in its wide applicability to surfaces of various materials and complex morphologies.

Another important aspect is the flexibility of the resulting contact film. The CdSe nanowires-filled PC membrane is a highly flexible substrate and the conductivity of the metal Au—Ag nanowire top contact did not seem to be affected by membrane curvature. This flexibility is an inherent property of such ultrathin nanowire films.

Methods of Application 1:
Preparation of the Metal Nanowire Films:
The nanowire preparation was carried out as detailed above in a solution of concentrated cetyltrimethylammonium bromide (CTAB) which acted as the templating surfactant. Chloroauric acid and silver nitrate were the Au and Ag precursors, respectively. Sodium ascorbate was used as a mild reducing agent. Mixing together all the components in the order of appearance above, at 35° C., resulted in the reduction of yellowish Au(III) ions to the colorless Au (I) state, thus forming a $[AuX_2]^-.CTA^+$ complex (X=Cl, Br). Similarly, the $Ag^+$ ions formed an $[AgX_2]^-.CTA^+$ complex [14]. Further reduction to the metallic state requires additional catalytic metal seed particles [15]. A relatively small amount of sodium borohydride dissolved in water was added to the precursor solution. The sodium borohydride addition resulted in the reduction of up to 0.014% of the metal ions, which then formed small metallic seed particles that catalyzed the reduction of the rest of the metal ions by the ascorbate ions.

Following the formation of the seed particles, about 500 μL of the growth solution were deposited on the front side membrane with the CdSe nanowires on a hot plate heated to 35° C. The elevated temperature was necessary for the prevention of surfactant precipitation for ~15 minutes. The substrate was then washed by gentle dipping for 1-5 minutes in an ethanol/water mixture (70/30% by volume). This deposition process was typically repeated 3 times. Prior to nanowire deposition the membrane edge was protected by coating it with silicon rubber (GE Bayer Silicones RTV 11/DBT) to avoid a short circuit between the two membrane faces.

The deposition processes were repeated over carbon coated copper grids, 1 $cm^2$ Si pieces and 2 $cm^2$ fused silica pieces for TEM, SEM and optical transmission measurements, respectively.

Metal Nanowire Film Characterizations:

The optical transparency of the films was measured against a reference substrate in a fiber-coupled array spectrophotometer (Ocean Optics, S2000) configuration, at a wavelength range of 400-900 nm. Sheet resistance measurements were carried out on the same substrates employing a Fluke true rms multi-meter using silver paste at the edges of fused silica substrates for defining the contacts.

CdSe Nanowire Array Preparation:

The vertical CdSe NWs array was electrochemically grown, employing a track-etched polycarbonate membrane as a template, as previously described. Briefly, polycarbonate membranes with a specified pore diameter of 100 nm and 6 μm thickness (Whatman Inc.) were coated with a 200 nm thick thermally-evaporated Au layer. This layer, defining the membrane's back side, served both as a working electrode for the electrochemical deposition process, and as a back contact electrode for the photoconductive device. The membrane was then placed in an electrochemical cell (containing 0.25M $CdSO_4$, 0.25M $H_2SO_4$, and 14 mM $SeO_2$). The deposition was carried out at room temperature employing a CHI621-A potentiostat (CH Instruments, Austin) with a platinum wire as the counter electrode and an Ag/AgCl (3M NaCl) reference electrode. During the electrodeposition process, the potential was held at a constant optimized voltage of 0.75 V (versus the Ag/AgCl reference electrode) for 20 minutes. Once the CdSe NWs were grown, the electrolyte solution was removed and the electrochemical cell was washed with distilled water, the membrane was carefully wiped and washed with water to remove CdSe residue grown on its surface and then dried under a dry $N_2$ stream.

Characterization of the CdSe nanowires was performed after dissolving the polycarbonate membrane using methylene chloride in 1.5 mL Eppendorf tubes. The NWs were then precipitated from the solution through 3 minutes centrifugation at 2500 rpm, and finally washed several times with methylene chloride. The full characterization details can be found elsewhere (Reddy, N. K.; Devika, M.; Shpaisman, N.; Ben-Ishai, M.; Patolsky, F. Synthesis and cathodoluminescence properties of CdSe/ZnO hierarchical nanostructures. *Journal of Materials Chemistry* 2011, 21, 3858-3864). Briefly, the CdSe NWs were found to be polycrystalline, with a chemical composition ratio Cd/Se of ca. 1/1.08.

Photoactive device characterizations were carried out in a two-probe configuration, employing a probe station (Janis, ST-500), with the bias applied between the Au bottom electrode to the TE via silver paste and the probe station tip. The voltage reading was converted to current using a preamplifier (DL 1211) and was collected through a computer-controlled rack-mounted breakout accessory (National Instruments, BNC 2090) and a DAQ card (National Instruments, PCI-MIO-16XE).

Application 2: Novel Repairable OLED Device Based on Au—Ag Nanowire Mesh

The next generation of optoelectronic devices requires transparent conductive electrodes to be flexible, cheap, and compatible with large scale manufacturing methods. Indium Tin Oxide (ITO) electrodes are often used in optoelectronic devices due to their superior transparency and conductance, however their fabrication demands vacuum conditions which restrict scale-up and they are also brittle and expensive. The major challenge in creating an alternative to ITO is the difficulty in achieving comparable transmittance and sheet resistance values. Reasonable changes in these values might not provide adequate electrodes for incorporation in efficient optoelectronic devices. In this work we present a novel method for the synthesis of a metal nanowire mesh (MNWM) electrode and an evaluation of its performance when incorporated into OLED devices with a comparison to ITO based devices. It was found that the failure rate for devices due to short circuits between the top and bottom electrodes was smaller in MNWM based devices compared to ITO based devices as the MNWM devices could be repaired to present normal OLED behavior following a spike in voltage. This presents an important advantage to ITO based devices which could not be repaired.

AuAg nanowire mesh (AuAgNWM) electrode was prepared. The substrate of choice for this process was fused silica and the penetration depth of the light in the solution was estimated to be 14 μm according to absorbance measurement of the precursor solution before exposure to light radiation (supporting information). This allows for an AuAgNWM to be formed in close proximity to the substrate/solution interface.

Figure 10:
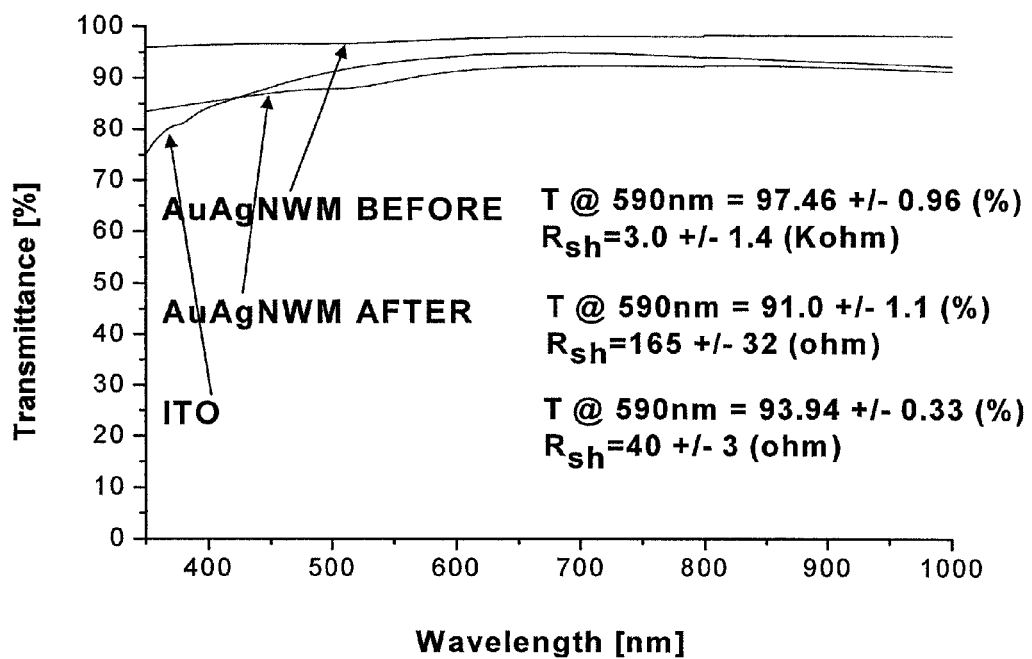
FIG. 10 provides the transmittance spectra of the nanowire film deposited by UV illumination seeding before dipping in the stabilizing solution (black line), and after dipping in the stabilizing solution (red line), and commercial ITO (blue line) with respective values of sheet resistance and transmittance at 590 nm.

The AuAgNWM film obtained by the uv-radiation method had transmittance (at 590 nm) and sheet resistance values of 97.46±0.96(%) and 3.0±1.4 (kohm), respectively (see FIG. 10). However, the initial sheet resistance was unstable and increases as time passed. The exact reason for conduction degradation is still not completely understood, but it is reasonable to assume that stability of nanowires requires proper surfactant capping which could be removed or damaged due to exposure to the humidity in air. In order to overcome this problem, gold was additionally precipitated on the nanowires by dipping the substrate for 10 minutes in a treatment solution containing the same concentration of CTAB and gold ions as the precursor solution. Additional gold ions precipitate primarily on the bare parts of nanowires thus protecting against disconnects. As a result of the treatment, transmittance and sheet resistance values were reduced to 91.0±1.1% and 165±32 (ohm) respectively. In addition to improving the conductivity by a factor of 18, the obtained sheet resistance does not increase more than 10% for at least one month. Characterization of the commercial ITO can be observed in FIG. 10, when sheet resistance was measured in the same way as described for AuAgNWM electrode.

Figure 11:
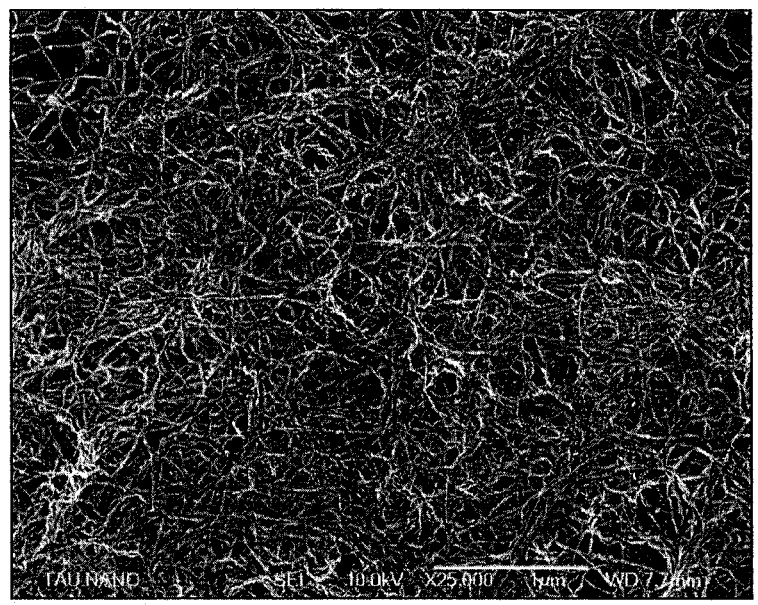
FIG. 11 is a SEM image of the nanowire film prepared on fused silica using the UV illumination seeding after the stabilizing bath (scale bar: 1 µm).

Shown in FIG. 11 is a SEM image of a AuAgNWM film after the treatment. Films created by this method were used as bottom electrodes for OLED devices.

Figure 12:
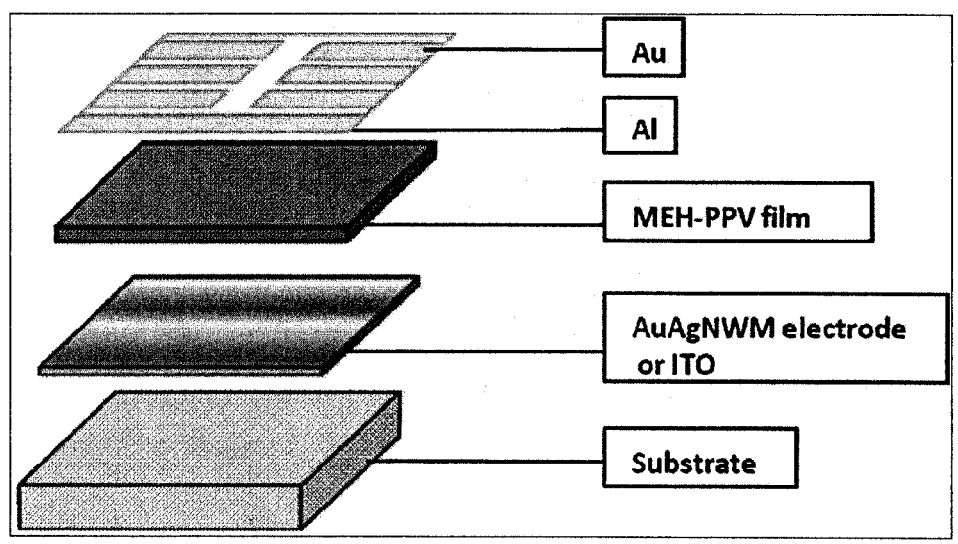
FIG. 12 is a scheme of OLED device based on a nanowire film bottom transparent electrode as a substitute to ITO.

FIG. 12 presents a schematic illustration of an OLED device based on an AuAgNWM electrode. The device can be easily fabricated and does not require any buffer (passivation) layers such PEDOT:PSS or LiF which are usually incorporated in OLED devices for adjusting the components' work functions. It is important to note that the work functions of ITO and AuAgNWM electrode, −4.7 eV and −5.1 eV respectively, are quite suitable for the organic layer of MEH-PPV used in the device, which has a HOMO of −5.02 eV. The work function of aluminum is −4.3 eV and therefore not as suitable for MEH-PPV's LUMO of −2.7 eV, however the incorporation of other top electrodes such as those based on calcium adds complexity and cost to the device and thus were dismissed.

Figure 13A:
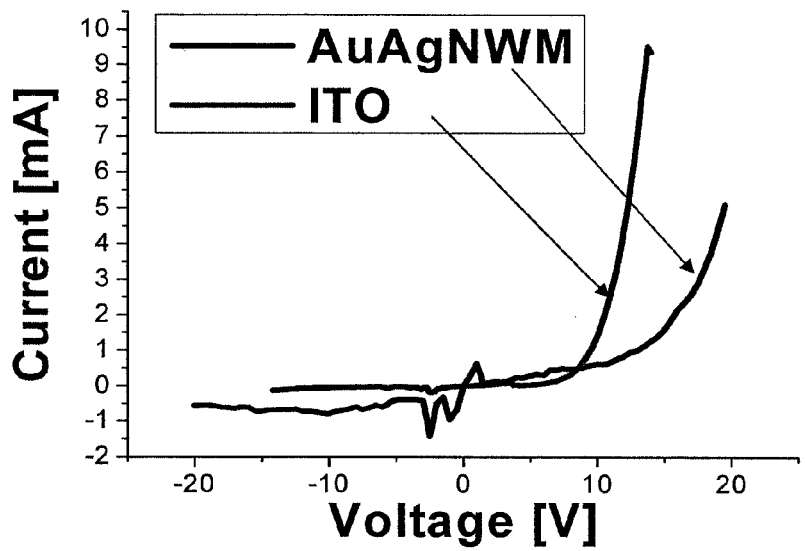
FIGS. 13A and 13B are.
Figure 13B:
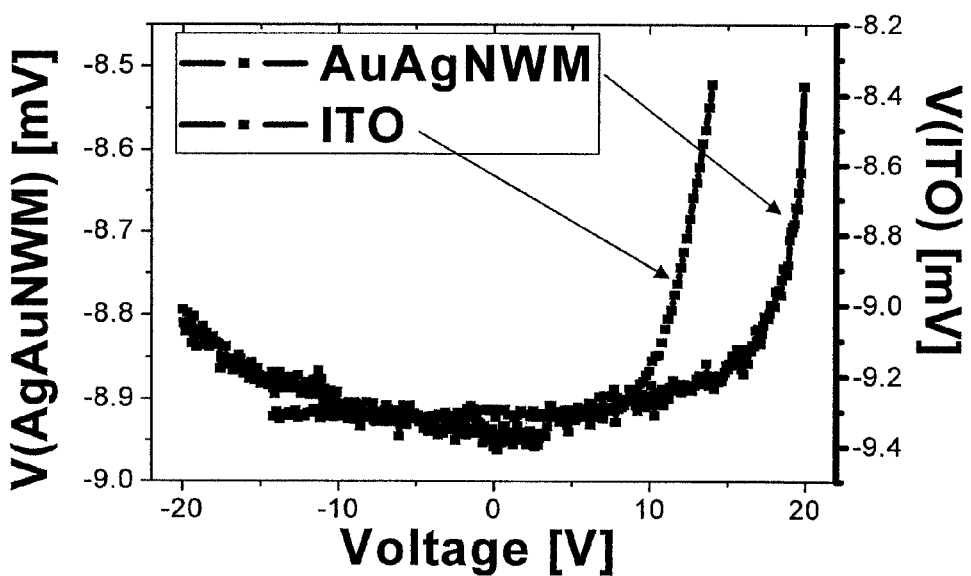

The I-V curves for both types of devices show typical OLED behavior and luminance characterizations have comparable efficiency proving that AuAgNWM electrodes are capable of functioning as alternatives to transparent conducting oxides (see FIG. 13). It is clearly seen that $V_{turn-on}$ of our electrode is higher and provides half the amount of light the ITO based OLEDs produce. The reasons for this are twofold; first, the conductivity of the AuAgNWM electrode is about a quarter of the conductivity of ITO. Secondly, the porous morphology of AuAgNWM electrode (see FIG. 11) means that there is a smaller effective area in comparison to the continuous ITO electrode. Despite these differences, the ITO based OLED provides only double the amount of light generated by the AuAgNWM based OLED. As in the case of CNT electrodes, the AuAgNWM electrode can be planarized with a buffer layer, such as a layer of PEDOT:PSS, in order to achieve uniform morphology, higher conductivity and improve hole-injection through the anode.

Figure 14:
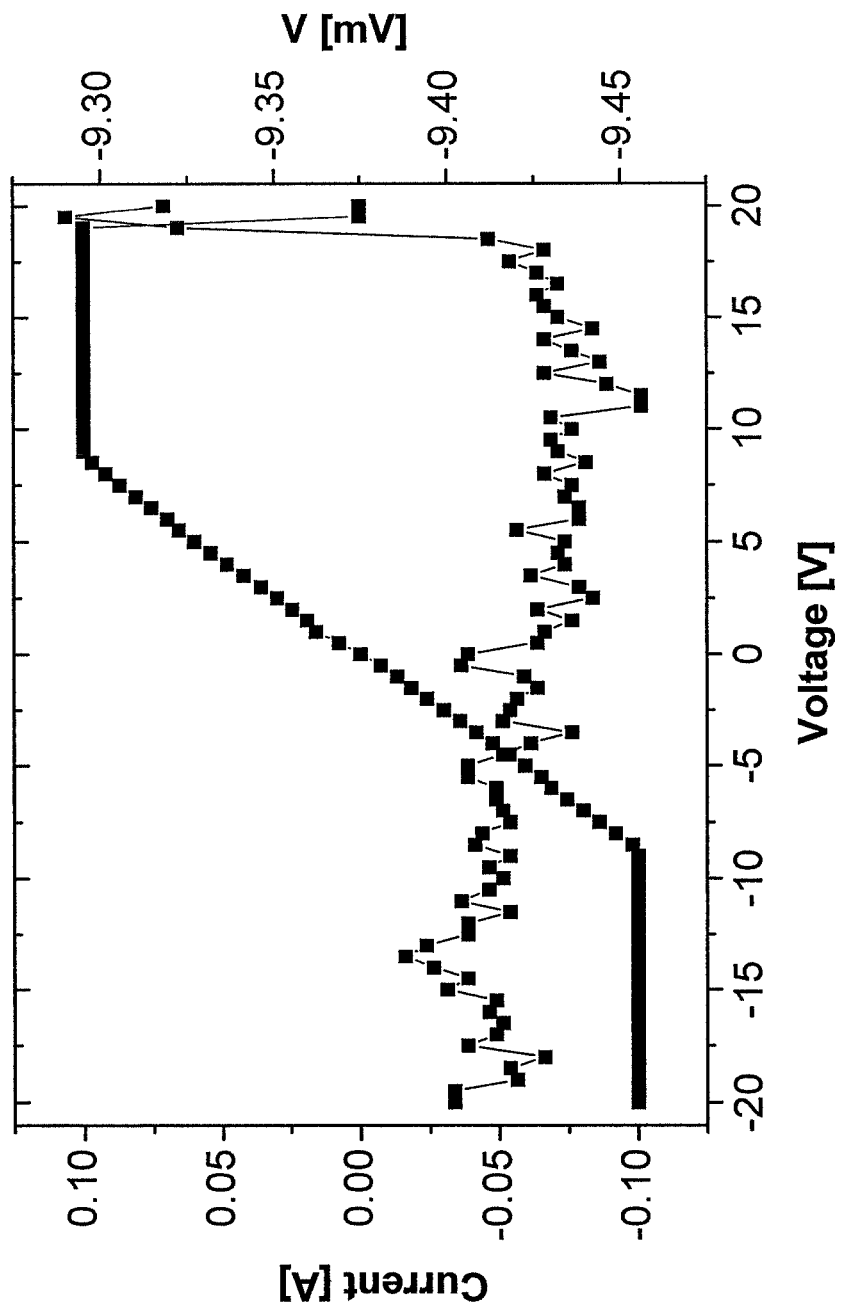
FIG. 14 is an I-V curve and output voltage of the photomultiplier (which is proportional to the light flux emitted from the device) as function of applied bias for the OLED device. The plateaus over ±10V in the I-V curve indicate reaching the current limit of the instrument. The sudden increase of light and simultaneous decrease of current represent burning of the nanowires at shorting pinhole(s), which caused the voltage drop to move from the shorting point-contact(s) to the whole conducting polymer thus enabling the charge injection into the polymer and consequent light emission.

Failure rate for ITO based devices due to short circuits between the top and bottom electrodes was found to be high and this phenomenon was also observed in AuAgNWM devices. Relatively small fluctuations around zero voltage in the I-V curve correspond to existence of electrical shorts. This is the same phenomenon which can be observed when using a CNT anode, as described earlier. However, as opposed to ITO based devices, it was found that AuAgNWM devices could be repaired to present normal OLED behavior following a spike in voltage (see FIG. 14). It appears that the spike in voltage caused short circuiting nanowires from the bottom electrode to be burned and thus could no longer short-circuit the device. This type of behavior has been previously demonstrated in device based on CNTs where an enhancement was observed in light emission when using a high bias of over 20V. This allowed for much lower failure rates for AuAgNWM OLED devices compared to ITO based devices, which could not be repaired.

The spectrum of light emitted from the OLED device is similar to other MEH-PPV devices described in the literature.
Methods of Application 2:
Precursor Solution:
the aqueous solution (10 ml) of cetyltrimethylammonium bromide (CTAB) (0.25M) was mixed with 500 μl of 25 mM tetrachloroauric acid ($HAuCl_4.3H_2O$) solution and 250 μl of 100 mM silver nitrate ($AgNO_3$) solution. Then 425 μl of 1.82M sodium ascorbate solution was added, and the color of the solution changed from a yellow-brown to a colorless one. The final step involved radiating the solution with a mercury lamp for 10 seconds. The light passes through the fused silica substrate, which was located at the liquid-air interface producing a solid (substrate)-liquid interface. Following a 25-minute period of incubation, the substrate was pulled out and the remaining thin film of the precursor solution was allowed to dry out for a few seconds. Then, the substrate was washed for 1 minute in an ethanol/water 70%/30% solution. Two strips of silver paint were applied on parallel edges of the substrate in order to create two electrodes for the measurement of sheet resistance.

Treatment Solution:
the aqueous solution (10 ml) of CTAB (0.25M) was mixed with 500 μl of 25 mM $HAuCl_4.3H_2O$ solution. The AuAgNWM substrates were subsequently dipped for 10 minutes in the treatment solution and washed for 1 minute in an ethanol/water 70%/30% solution.

OLEDs were fabricated with AuAgNWM electrodes as well as on commercial ITO electrodes. The two types of transparent electrodes were used as a bottom electrode on which a solution of MEH-PPV in chloroform (3 mg/ml) was spin coated at 1500 rpm for 40 seconds. Top contacts were evaporated over the MEH-PPV layer by consecutive deposition of aluminum and gold, using a shadow mask (see FIG. 12). The devices were examined with an electroluminescence measurement system. For each device the I-V and luminance curves were produced and in addition the electroluminescence spectrums were measured at maximum light output.

The same type of devices can also be fabricated using the standard nanowire deposition technique with borohydride reduction trigger or addition of pre-prepared small metal seed particles (typically ≤2 nm in size). There is no basic difference in the films prepared by UV irradiation and this type.

The invention claimed is:

1. A process for the preparation of a conductive film, the process comprising:
   (a) obtaining an aqueous precursor solution, said solution being prepared by:
      (i) forming a solution of at least one surfactant at a concentration of between 1-10% (w/w), at least one gold metal precursor and sodium ascorbate in an aqueous medium;
      (ii) adding at least one silver metal precursor;
   (b) forming a layer of the solution of step (a) on at least a portion of a surface of a substrate; allowing formation of a layer of metal nanowires; and
   (c) optionally repeating step (b) one or more times on top of a preceding layer, as detailed hereinabove;
   (d) treating the film with a solution comprising at least one surfactant, at least one metal precursor and at least one weak metal reducing agent;
   thereby obtaining a gold/silver nanowire film on at least a portion of a surface.

2. A process for the preparation of a conductive film, the process comprising:
   (a) obtaining an aqueous precursor solution, said solution being prepared by:
      (i) forming a solution of at least one surfactant at a concentration of between 1-10% (w/w), at least one gold metal precursor and at least one silver metal precursor and at least one ascorbate reducing agent in an aqueous medium;
      (ii) adding a metal borohydride, and/or nanoparticles selected from metal nanoparticles, semiconductor nanoparticles and metal oxide nanoparticles;
   (b) forming a layer of the solution of step (a) on at least a portion of a surface of a substrate; allowing formation of a layer of metal nanowires; and (c) optionally repeating step (b) one or more times on top of a preceding layer;
(d) treating the film with a solution comprising at least one surfactant, at least one metal precursor and at least one weak metal reducing agent;
thereby obtaining a gold/silver nanowire film on at least a portion of said surface.

3. An electrode structure comprising a conductive film according to claim 1.

4. A device integrated with a film according to claim 1, the device being selected from photoconductors, photodiodes; solar cells; light emitting diodes (LEDs), organic light emitting diodes, lasers; light sensors, specialized transistors, organic transistors, inorganic transistors, and hybrid transistors.

5. An electrode structure comprising a conductive film according to claim 2.

6. A device integrated with a film according to claim 2, the device being selected from photoconductors, photodiodes; solar cells; light emitting diodes (LEDs), organic light emitting diodes, lasers; light sensors, specialized transistors, organic transistors, inorganic transistors, and hybrid transistors.

* * * * *